(12) United States Patent
Fukuda

(10) Patent No.: US 9,266,319 B2
(45) Date of Patent: Feb. 23, 2016

(54) PRINTING DEVICE USING ENDLESS BELT-SHAPED PRINTING PLATE

(75) Inventor: Manabu Fukuda, Misato (JP)

(73) Assignee: YUGENGAISHA MISATOMIRAI21, Tokyo (JP)

(*) Notice: Subject to any disclaimer, the term of this patent is extended or adjusted under 35 U.S.C. 154(b) by 182 days.

(21) Appl. No.: 13/882,599

(22) PCT Filed: Nov. 2, 2011

(86) PCT No.: PCT/JP2011/075302
§ 371 (c)(1),
(2), (4) Date: Apr. 30, 2013

(87) PCT Pub. No.: WO2012/060413
PCT Pub. Date: May 10, 2012

(65) Prior Publication Data
US 2013/0220154 A1    Aug. 29, 2013

(30) Foreign Application Priority Data

Nov. 4, 2010   (JP) ................................. 2010-247732

(51) Int. Cl.
*B41F 13/08*    (2006.01)
*B41F 5/04*     (2006.01)
(Continued)

(52) U.S. Cl.
CPC ............... *B41F 17/007* (2013.01); *B41F 13/10* (2013.01); *B41M 1/04* (2013.01); *B41N 1/12* (2013.01); *G03F 7/2014* (2013.01); *G03F 7/2022* (2013.01)

(58) Field of Classification Search
CPC ........ B41F 13/10; B41F 17/007; B41M 1/04; B41N 1/16; B41N 1/22
USPC .................. 101/395, 111, 105, 375, 376, 219
See application file for complete search history.

(56) References Cited

U.S. PATENT DOCUMENTS

| 3,518,940 A | 7/1970 | Stroud et al. |
| 4,535,694 A | 8/1985 | Fukuda |
| 4,817,525 A * | 4/1989 | Yagi .............................. 101/219 |

FOREIGN PATENT DOCUMENTS

| JP | 45 26089 | 10/1970 |
| JP | 51 10128 | 4/1976 |

(Continued)

OTHER PUBLICATIONS

English translation of the International Preliminary Report on Patentability and Written Opinion of the International Searching Authority issued Dec. 13, 2011, in PCT/JP2011/075302, filed Nov. 2, 2011.
(Continued)

*Primary Examiner* — Leslie J Evanisko
(74) *Attorney, Agent, or Firm* — Oblon, McClelland, Maier & Neustadt, L.L.P.

(57) ABSTRACT

A printing technology wherein an endless belt-shaped printing plate is wound about a plate cylinder and a guide roller of a printing cylinder and, by using the printing plate, a continuous form sent between the printing plate and an impression cylinder is printed. In the plate cylinder, feed pins are disposed in rows at an even pitch along an outer periphery of the cylinder. The feed pins are guided by a fixed cam ring and project and retract freely and project in a desired region of the plate cylinder, respectively with respect to the cylinder surface. Pin feed holes are provided in rows in marginal zones of the endless belt-shaped printing plate. The endless belt-shaped printing plate is formed by joining and bonding both ends of an elongated resinous relief printing plate with an adhesive tape from the printing surface side. The pin feed holes are engaged with the feed pins of the plate cylinder, whereby the plate feed is guided.

11 Claims, 12 Drawing Sheets

(51) Int. Cl.
*B41F 17/00* (2006.01)
*B41F 13/10* (2006.01)
*B41M 1/04* (2006.01)
*B41N 1/12* (2006.01)
*G03F 7/20* (2006.01)

(56) References Cited

FOREIGN PATENT DOCUMENTS

| JP | 58 174950 | 10/1983 |
| JP | 60 30342 | 2/1985 |
| JP | 60 48355 | 3/1985 |
| JP | 60 192434 | 12/1985 |
| JP | 63 123549 | 8/1988 |
| JP | 2004 74526 | 3/2004 |
| JP | 2010 175964 | 8/2010 |

OTHER PUBLICATIONS

International Search Report Issued Dec. 13, 2011 in PCT/JP11/75302 Filed Nov. 2, 2011.

* cited by examiner

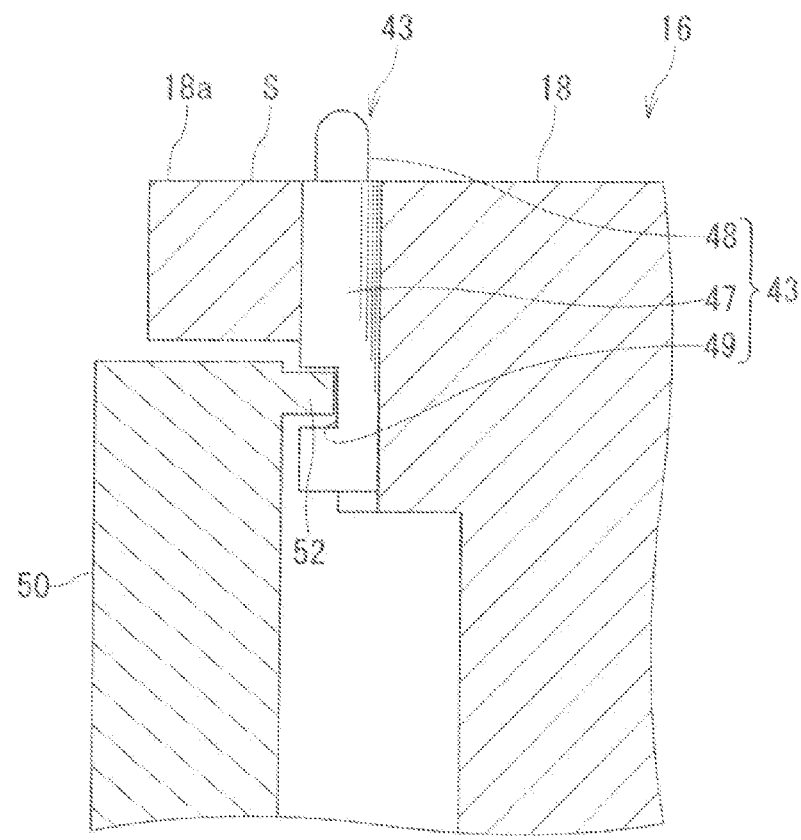

| | AVERAGE EXPOSURE (mJ/cm²) | TOTAL BASE THICKNESS T (μm) | RESIDUAL RESIN V (BACK DEPOSIT LAYER) (μm) | RELIEF DEPTH D (μm) |
|---|---|---|---|---|
| RELIEF EXPOSURE | 520.1 | - | - | - |
| COMP. EX. 1 | 12.8 | 220 | 0 | 730 |
| COMP. EX. 2 | 17.8 | 220 | 0 | 730 |
| COMP. EX. 3 | 19.8 | 220 | 0 | 730 |
| COMP. EX. 4 | 22.2 | 220 | 0 | 730 |
| COMP. EX. 5 | 24.7 | 220 | 0 | 730 |
| COMP. EX. 6 | 29.7 | 320 | 100 | 630 |
| EX. 1 | 34.6 | 460 | 240 | 490 |
| EX. 2 | 44.9 | 570 | 350 | 380 |
| EX. 3 | 47.0 | 600 | 380 | 350 |
| EX. 4 | 49.9 | 620 | 400 | 330 |
| EX. 5 | 52.0 | 640 | 420 | 310 |
| EX. 6 | 52.3 | 660 | 440 | 290 |
| EX. 7 | 54.3 | 680 | 460 | 270 |
| EX. 8 | 61.1 | 690 | 470 | 260 |
| EX. 9 | 64.3 | 700 | 480 | 250 |
| EX. 10 | 66.3 | 730 | 510 | 220 |
| EX. 11 | 68.2 | 760 | 540 | 190 |
| EX. 12 | 68.8 | 780 | 560 | 170 |
| EX. 13 | 71.7 | 820 | 600 | 130 |
| COMP. EX. 7 | 73.9 | 850 | 630 | 100 |
| COMP. EX. 8 | 82.3 | 880 | 660 | 70 |
| COMP. EX. 9 | - | 910 | 690 | 40 |

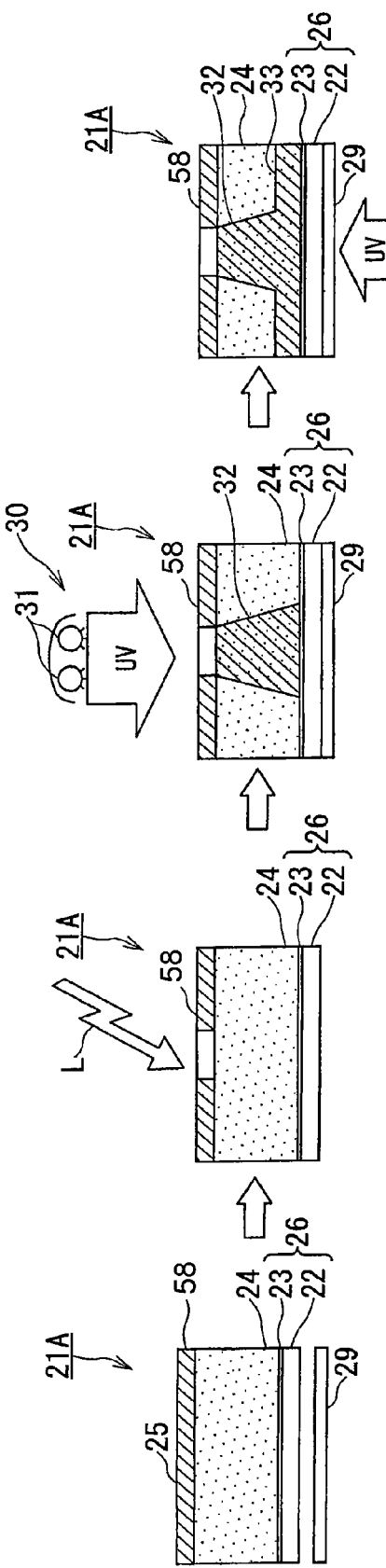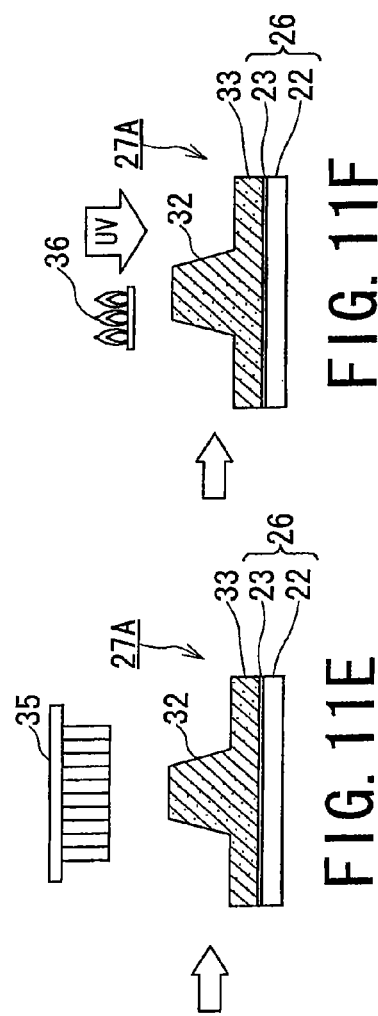

FIG. 12

PRINTING DEVICE USING ENDLESS BELT-SHAPED PRINTING PLATE

TECHNICAL FIELD

The present invention relates to a printing technology using an endless belt-shaped printing plate, particularly a printing apparatus using an endless belt-shaped printing plate including an endless belt-like resinous relief (or letterpress) printing plate for printing on a continuous business form, a printing method using the apparatus, and a method of attaching the belt-shaped printing plate.

BACKGROUND ART

The present inventor developed basic printing technologies wherein an endless belt-shaped printing plate for continuously effecting printing on a continuous form (or business form), and the printing technologies were proposed in U.S. Pat. No. 4,535,694A, U.S. Pat. No. 4,758,021A, JP 59157B, JP 2000-255179, etc.

These printing technologies are each designed to use a flexible endless belt-shaped resinous relief printing plate to effect printing on a continuous business form (continuous paper form) fed out from a feed roll.

The technology of printing on a continuous business form using an endless belt-shaped printing plate is applied to printing on forms, such as payment paper for pension and insurance, or tax, calendar, contract, operation manual, specification, publication booklet, a seedling raising sheet.

Moreover, in recent years, it is also widely used for printing for producing sheet articles requiring high quality and high security, such as service tickets, travel tickets, gift certificates, vouchers, shopping tickets, money coupons, stock certificates, and debenture, from a continuous form provided in the form of a feed roll,

PRIOR ART DOCUMENTS

Patent Documents

[Patent document 1] JP2000-255179A
[Patent document 2] JP4-59157B
[Patent document 3] U.S. Pat. No. 4,535,694A
[Patent document 4] U.S. Pat. No. 4,758,021A

SUMMARY OF INVENTION

Problems to be Solved by the Invention

Conventional printing apparatus using an endless belt-shaped printing plate have included a plate cylinder which is hollow because of a light weight. However, a hollow plate cylinder is accompanied with problems, such that fabrication of a true circular cylinder is difficult, rotation balance thereof cannot be achieved easily, and the plate cylinder can cause irregular movement, such as bounding or shaking due to printing pressure at the time of printing, leading to printing unevenness or deviation. Such an irregular movement of the plate cylinder leads to printing pressure unevenness which, in combination with slippage between inking rollers, makes it difficult to provide clear, accurate and beautiful prints.

In recent years, with progress of the printing technology which allows printing on a continuous form by using an endless belt-shaped printing plate, there have been increasing demands for improvement in printing accuracy and fineness, ensured security, up-graded printing, and development of printing technology providing printed products which do not allow forgery or cannot be reproduced by copying machines.

Moreover, also with respect to the relief printing technology using an endless belt-shaped printing plate, there has been a demand for realizing fine microscopic characters or photographic printing of more than 175 lines, e.g., 300 lines.

The present invention has been achieved in consideration of the situation mentioned above, and aims at providing a printing apparatus using an endless belt-shaped printing plate and a printing method that allow clear and beautiful printing with sufficient accuracy and no printing unevenness, even by using a light-weight resinous relief printing plate in a form of an endless belt-shaped printing plate, and also a method of attaching a belt-shaped printing plate therefor.

Another object of the present invention is to provide a printing apparatus including an endless belt-shaped printing plate for printing on a continuous form and allowing printing of fine microscopic characters (e.g., printing of 0.5 point of Chinese characters) or photographic printing of more than 175 lines and up to 300 lines in terms of screen lines with improved security, and also a printing method using the apparatus and a method of attaching a belt-shaped printing plate therefor.

Another object of the present invention is to provide a printing apparatus and a printing method using an endless belt-shaped printing plate, wherein a light-weight endless elongated belt-shaped printing plate is used for allowing halftone dot printing of up to 300 lines and fine microscopic character printing (of, e.g., printing of numerals of 0.4 point) with improved security, and improved durability, pressure resistance and improved printing durability, and also a method of attaching a belt-shaped printing plate therefor.

Another object of the present invention is to provide a printing apparatus and a printing method using an endless belt-shaped printing plate, wherein a pressure cylinder and an impression cylinder, which are highly accurate, tough and pressure-resistant, are fed stably, accurately and surely, without causing slippage or displacement of the endless belt-shaped printing plate, and also a method of attaching a belt-shaped printing plate therefor.

Means for Solving the Problems

The printing apparatus using an endless belt-shaped printing plate of the present invention has been developed in order to solve the above-mentioned problem and, more specifically, includes: a plate cylinder, a guide roller and an endless belt-shaped printing plate wound about the plate cylinder and the guide roller for printing on a continuous form supplied between the plate cylinder and an impression cylinder, wherein
said plate cylinder and impression cylinder are each composed as a solid cylinder,
said plate cylinder is provided with feed pins which are disposed in rows at an even pitch along an outer periphery of the plate cylinder at both ends in the axial direction of the plate cylinder so as to project and retract freely and guided by a fixed cam ring and so as to project out of the plate cylinder surface at least in a region opposite to the guide roller with respect to the plate cylinder,
said endless belt-shaped printing plate is provided with pin feed holes at its marginal zones at both sides in its width direction so that the pin feed holes are disposed in rows along the longitudinal direction of the endless belt-shaped printing plate at a pitch which is identical to the pitch of said feed pins,
said endless belt-shaped printing plate is formed endless by abutting and joining both ends each provided with a concavo-convex or zigzag unevenness pattern of an elongated resinous relief printing plate so that both ends are engaged with each other and bonded with an adhesive tape applied from the printing surface side, and said pin feed holes formed at the marginal zones of the endless belt-shaped printing plate are engaged with said feed pins of the plate cylinder, thereby guiding the movement of the endless belt-shaped printing plate.

Moreover, being developed in order to solve the above-mentioned objects, the present invention also provides: a printing method using an endless belt-shaped printing plate wound about a plate cylinder and a guide roller for printing on a continuous form supplied between the plate cylinder and an impression cylinder, wherein said plate cylinder and impression cylinder are each composed as a solid cylinder, said plate cylinder is provided with feed pins which are disposed in rows at an even pitch along an outer periphery of the plate cylinder at both ends in the axial direction of the plate cylinder so as to project out of the plate cylinder surface at least in a region opposite to the guide roller with respect to the plate cylinder, said endless belt-shaped printing plate is provided with pin feed holes formed at the marginal zones thereof, and moved and guided by sequentially engaging the pin feed holes with said feed pins of the plate cylinder, thereby guiding the movement of the endless belt-shaped printing plate, and an ink is applied onto a plate surface of the endless belt-shaped printing plate and transferred onto a continuous form supplied between the plate cylinder and the impression cylinder, thereby performing printing.

Being developed in order to solve the above-mentioned objects, the present invention further provides: A method of attaching an elongated printing plate to form an endless belt-shaped printing plate wound about a plate cylinder and a guide roller, wherein said plate cylinder is provided with feed pins which are disposed in rows at an even pitch along an outer periphery of the plate cylinder at both ends in the axial direction of the plate cylinder so as to project and retract freely and guided by a fixed cam ring so as to project out of the plate cylinder surface at least in a region opposite to the guide roller with respect to the plate cylinder, an elongated resinous relief printing plate is provided with pin feed holes at an even pitch in marginal zones at both ends in its width direction along with a longitudinal direction, and also provided with a concavo-convex or zigzag unevenness pattern at both longitudinal ends thereof and along a width direction, said resinous relief printing plate is inserted from the guide roller side and moved to above and wound around the plate cylinder while engaging the pin feed holes of the resinous relief printing plate with the feed pins of the plate cylinder one by one, then, a front end of the resinous relief printing plate is taken out from between the plate cylinder and the impression cylinders, wound about the guide roller, and reversely returned toward the plate cylinder, the front end is abutted to and engaged with a rear end of the resinous relief printing plate, and an adhesive tape is applied over the front end and the rear end engaged with each other onto the printing surface side of the resinous relief printing plate, thereby joining the front and rear ends to form an endless belt-shaped printing plate, and then the guide roller is retreated from the plate cylinder to adjust a tension exerted to the endless belt-shaped printing plate, thereby attaching the endless belt-shaped printing plate to a printing apparatus.

Using an endless belt-shaped printing plate, the present invention can perform clear and beautiful printing with sufficient accuracy and correctness and without causing printing unevenness. Further, it becomes possible to perform printing of fine microscopic characters and photographic printing on a continuous form, thereby providing improved security. Further, the endless belt-shaped printing plate is light in weight and improved in printing durability and pressure resistance.

Moreover, by using a solid plate cylinder and a solid impression cylinder in the present invention, it becomes easy to fabricate the cylinders with a good rotation balance, leading to little irregular movement. Further, it becomes possible to move the endless belt-shaped printing plate with accurate guidance and without slippage or displacement. Even when an endless belt-like resinous relief printing plate is used, it is possible to effect printing of micro-characters down to 0.3 point and dot printing or photographic printing of up to 300 screen lines (L). Further, by producing background design (or patter) or hidden characters (characters which cannot be read with naked eyes), it becomes possible to provide print products with enhanced security, thus providing printing technology with improved security.

Furthermore, according to the method of attaching a belt-shaped printing plate of the present invention, an elongated resinous relief printing plate of lightweight, can be attached to the plate cylinder of a printing apparatus without causing longitudinal slip or displacement. The movement of the resinous relief printing plate is guided by utilizing the pin feed holes thereof and the feed pins of the plate cylinder. After winding the resinous relief printing plate around the plate cylinder and the guide roller, the front end of the resinous relief printing plate is abutted to and engaged with the rear end thereof, and an endless belt-shaped printing plate can be formed only by applying an adhesive tape over the front end and the rear end thus engaged with each other onto the printing surface side of the resinous relief printing plate. Only by adjusting a tension exerted to the thus-formed endless belt-shaped printing plate in a wound state, the endless belt-shaped printing plate can be moved for printing without causing slip or displacement in the longitudinal or transversal direction. Moreover, since the endless belt-shaped printing plate is used for printing while its flat film surface region not affected by the thickness of the adhesive tape contacts the plate cylinder surface, an adverse effect associated with stepwise difference given by the adhesive tape is avoided. As a result, even if an endless belt-like resinous printing plate is used, it is possible to effect beautiful and exact printing without printing unevenness, more specifically it becomes possible to even realize relief printing technology capable of printing of fine microscopic characters and halftone dot or photographic printing of up to 300 lines.

BRIEF DESCRIPTION OF THE DRAWINGS

FIG. 8(A) is a figure showing a state where the feed pins project from the plate cylinder, and FIG. 8(B) is a view showing a state where the feed pins retreat in the plate cylinder.

FIGS. 11A-11F show a manufacturing process of a photosensitive resin relief printing plate from a CPT plate material of a photosensitive resin relief printing plate, in which FIGS. 11(A)-11(F) illustrate respective steps involved in the process.

FIG. 12 is a configuration diagram illustrating a principle of a rotary press-type printing machine as a second embodiment of the printing apparatus according to the present invention.

EMBODIMENTS OF THE INVENTION

Some embodiments of the present invention will be described with reference to accompanying drawings.

First Embodiment

Figure 1:
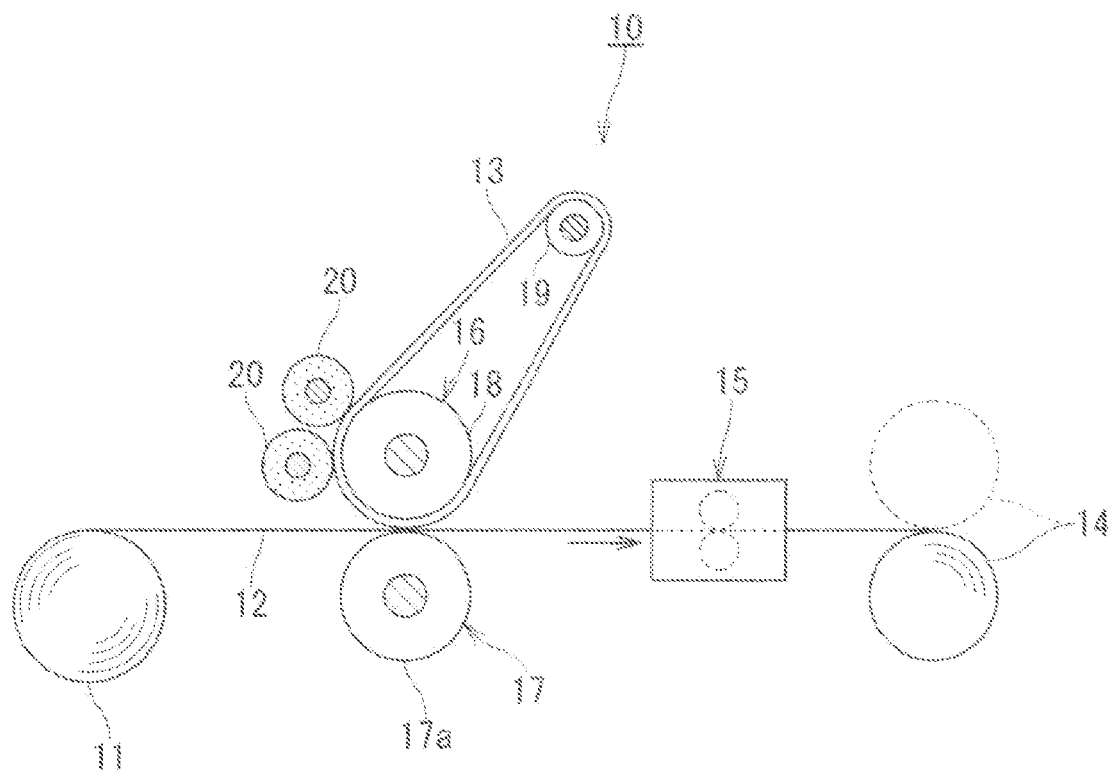
FIG. 1 is a configuration diagram illustrating a principle of a rotary press-type printing machine as a first embodiment of the printing apparatus according to the present invention.

FIG. 1 is a configuration diagram showing a principle of a first embodiment of the printing apparatus using an elongated flexible endless belt-shaped printing plate.

A printing apparatus 10 is a rotary press type printing machine including an endless belt-shaped printing plate 13 for printing on a continuous form 12 which is an elongated continuous form (roll) released from a feeding roll 11. The continuous form 12 after the printing may be taken up as a roll 14, or folded up in a zigzag shape by a folding machine (not shown) and accumulated, or further cut into individual sheets by a cutting equipment 15, to be stored in a storage box (not shown).

The printing apparatus 10 includes a plate cylinder 16 equipped with an endless belt-shaped printing plate 13, and an impression cylinder 17 as a receiver cylinder. The endless belt-shaped printing plate 13 is wound about the plate cylinder 16 (or 18) and a freely rotating guide cylinder (guide roller) 19 as a follower or driven roller. The guide cylinder 19 is disposed freely movable toward and retractable from the plate-cylinder 16 side, so as to allow an adjustment of the tension exerted to the endless belt-shaped printing plate 13. The solid impression cylinder 17 cooperates with the endless belt-shaped printing plate 16 at a position where the endless belt-shaped printing plate 13 is wound about the plate cylinder, to form a nip through which the continuous form 12 can pass to print on the continuous form. Ink rollers 20, e.g., in a pair, are disposed opposite to the plate cylinder 16 and in contact with the outer surface of the endless belt-shaped printing plate 13, so as to transfer an ink to the printing surface (plate surface) of the endless belt-shaped printing plate 13.

The plate cylinder 18(16) and the impression cylinder 17a are composed not as hollow cylinder but as solid cylinders, e.g., by filing or sawing, e.g., of steel. A solid (steel) cylinder has a good rotation balance, is easy to fabricate it into a true circular cylinder and is heavy in weight (e.g., 300 kg), so that it is less liable to cause irregular movement, such as bounding, due to repulsion of a printing pressure, when formed as a plate cylinder 16. By forming the plate cylinder 16 (18) and the impression cylinder 17a as solid cylinders, bending due to printing pressure can be decreased, so that in printing of a solid image and a halftone image in mixture, the halftone image is not collapsed or soiled and the solid image is beautifully reproduced.

The endless belt-shaped printing plate 13 can be formed to have a longitudinal one-circumferential length suitably chosen from a range of several tens of cm to several tens of m. The endless belt-shaped printing plate 13 may be formed into an endless-shape by joining both ends of a long and slender flexible elongated resinous relief printing plate. Moreover, it is also possible to join two or more sheets, e.g., 400-inch-long elongated printing plates, sequentially, and finally join both ends of the resultant joined longer sheet to form an endless belt of several meters to several tens of meters.

Incidentally, a flexible elongated endless belt-shaped printing plate 13 may be formed from an elongated photosensitive resin relief printing plate formed by using a plate material for a photosensitive resin relief printing plate or CPT plate material disclosed in the specification and drawings of Japanese patent application No. 2009-201949.

[Resinous Relief Printing Plate]

As a plate material 21 of the photosensitive resin relief pattern used for a flexible resinous relief printing plate, it is suitable to use a plate material for analog plates or digital plates, such as those known by product name (FUJI TORELIEF) WF95BII WF95BSII, WF95EBSII, WF70BII and WF70BSII, available from Fuji Photo Film Graphic Systems Incorporated.

The plate material 21 for a flexible photosensitive resin relief printing plate, is suitably a soft flexible plate material having a Shore A hardness of 30 to 40 degrees, a longitudinal length of several meters to 9 meters, a width of about 45 cm-51 cm (17 inches-21 inches), and an overall thickness of less than 2 mm, e.g., 0.60 mm-0.95 mm, or 1.14 mm, used as an analog plate. A preferred example of the desirable plate material 21, may be an analog plate material having a longitudinal length of 8.5 m, a width of 48 cm and a thickness of 0.95 mm in view of environmental characteristic and fine accuracy required in the field of relief printing.

The plate material 21 of a photosensitive resin relief plate may be formed as a laminate including a base film 22 of polyester (PET) as a substrate, on which a photosensitive resin layer 24 is laminated by the medium of an adhesive layer 23, and also a cover film 25 applied on the photosensitive resin layer 24.

A preferred example of the plate material 21 has a plate thickness of 950 µm, including a base film 22 thickness of 188 µm, an adhesive layer 23 thickness of 32 µm functioning as a halation-preventing layer and a photosensitive resin layer 24 thickness of 730 µm, wherein a film base 26 (base film 22+adhesive layer 23) functioning as a film support medium occupies a base thickness of 220 µm.

Another preferred example of the plate material 21 available from Toray Industries, Inc. has a plate thickness of 1.14 mm (1140 µm), including a base film 22 thickness of 188 µm, an adhesive layer 23 thickness of 32 µm functioning as a halation-preventing layer and a photosensitive resin layer 24 thickness of 920 μm, wherein a film base 26 (base film 22+adhesive layer 23) functioning as a film support medium occupies a base thickness of 220 μm.

The base film 22 may also comprise a polyethylene terephthalate film (PET film), etc. other than the polyester film, and the adhesive layer 23 may comprise various commercially available coating adhesive materials, such as rubber type, polyester type, epoxy type, acrylic type, urethane type, and silane type, coupling agents used for anchor processing, and acrylic hard coating materials. Moreover, the photosensitive resin layer 24 may for example comprise a photo-curable resin composition including a polymerizable compound and a photo polymerization initiator, which is photo-cured in response to ultraviolet irradiation. Such a polymerizable compound may for example comprise oligomers of epoxy acrylate and urethane acrylate, polymerizable monomers, such as poly-functional acrylates, or mixtures of these. The photopolymerization initiator, may comprise a benzoin-based photopolymerization initiator or an acetophenone-based initiator. The photo-curable resin can be used together with a solvent and/or an additive.

Moreover, the photosensitive resin layer 24 may also comprise a photo-curable resin composition including an unsaturated polyester resin or an unsaturated resin formed by introducing an unsaturated group into polybutadiene, acrylic resin, urethane resin, etc., and also a photosensitizer or a thermal stabilizer added thereto.

[Production of a Resinous Relief Printing Plate]

Next, production of a flexible resinous relief printing plate 27 is explained using a plate material 21 having a thickness of 950 μm for photosensitive resin relief printing plates.

For production of a flexible resinous relief printing plate 27, the plate material 21, a negative film 28 as a plate-making film and a positive film 29, are provided first (FIG. 2(A)). The negative film (plate-making film) 28 is intimately applied to the plate material 21 from which the cover film 25 has been removed from the front side, under vacuum for preventing the relative movement and uneven adhesion between the plate material 21 and the negative film 28. On the negative film 28, a cover film (not shown), such as a polyvinyl chloride sheet, may be applied by vacuum adhesion etc. as needed.

[Exposure Step]

After positional alignment and fixation under vacuum of the negative film 28 and the plate material 21 as shown in FIG. 2(B), the laminate is led to a lamp house of an exposure device 30 shown in FIG. 2(C), and the laminate is guided at a prescribed rate within the lamp house. Within the lamp house, relief exposure is performed by an exposure step of irradiating the laminate with ultraviolet radiation (315 nm-400 nm) (UV) from plural (e.g., 2) UV sources 31 disposed in parallel in a direction perpendicular to the run direction. For the relief exposure, actinic light sources, such as a mercury-vapor lamp and a canon lamp can also be used instead of ultraviolet radiation.

In the relief exposure, the plate material 21 moved at a prescribed velocity is irradiated with ultraviolet radiation of about 500 mJ/cm$^2$ from the tubular ultraviolet light sources 31 through the negative film 28, as shown in FIG. 2(C). If the ultraviolet radiation is incident to a soft (yet-uncured) photosensitive resin layer 24 through the negative film 28, the whole layer thickness the photosensitive resin layer 24 at the exposed part is cured, i.e., hardened, to provide a relief image (relief part: printing surface) 32 of a character or a picture is formed in the photosensitive resin layer 24 of the plate material 21 in the shape of a taper broadening toward the base film 21.

A relief exposure (quantity) with ultraviolet radiation of 490 mJ/cm$^2$-530 mJ/cm$^2$, preferably 500 mJ/cm$^2$-520 mJ/cm$^2$, may be used for printing exposure, as will be described later. In relief exposure, an exposure of about 500 mJ/cm$^2$ may provide a relief image with a relief depth of 730 μm in the exposed part (relief part) of the photosensitive resin layer 24.

The plate material 21 after the vacuum adhesion of and the printing exposure through the negative film 28, is then reversed, and a positive film 29 is disposed in alignment with the negative film 28 and attached under vacuum onto the back side of the plate material 21. Although it is desirable to use a positive film from the back side, it is not necessary to use such a positive film. By the vacuum attachment, the development of adhesion unevenness is prevented also between the plate material 21 and the positive film 29. A cover film (not shown) of, e.g., polyvinyl chloride, may also be applied to the positive film 29 by vacuum adhesion, etc. if needed.

More specifically, the plate material 21 after the relief exposure for printing exposure is once taken out of the lamp house and then reversed, and a positive film 29 is disposed in alignment and attached under vacuum onto the back side of the plate material 21. Then, the plate material 21 is again sent into the lamphouse, and back exposure is performed. In the back exposure, ultraviolet radiation is incident at an exposure of 30 mJ/cm$^2$-60 mJ/cm$^2$ through the positive film 29 into the plate material 21 from the film base 26 side to cause solidification, thereby forming a back deposit layer (back solidified layer) 33 all over the photosensitive resin layer 24 on the film base 26 side of the plate material 21 (refer to FIG. 2(D)).

The back deposit layer 33 is formed by solidifying (photocuring) the photosensitive resin layer 24 all over the film base 26 side in a thickness range of about 130 μm-600 μm, preferably 200 μm-550 μm as will be mentioned later. The back deposit layer 33 is integrally formed with the film base 26 as the film support, and raises the mechanical and physical strengths of the plate surface of the photosensitive resin relief printing plate 27. A larger thickness of the back deposit layer 33 provides lager mechanical and physical strengths of the plate material 21.

FIGS. 2(C) and 2(D) have shown an example wherein back exposure is performed after performing the relief exposure to the plate material 21 of a photosensitive resin for relief printing plate. However, it is also possible to perform the relief exposure and the back exposure simultaneously from the front side and back side of the plate material 21, or perform the back exposure in advance of the relief exposure.

[Water Washing Step]

The plate material 21 after the photocuring by the relief exposure and back exposure in the exposure steps is, after removing the negative film 28 and the positive film 29 therefrom, sent to a water washing step. In the water washing step, washing with water is performed by using a flat-type washing brush 35 installed freely slidably in a washing apparatus (not shown) enabling a free slide, to effect washing with water of ordinary temperature, e.g., at 20-25° C., as shown in FIG. 2(E). In the washing with water, the plate material 21 is washed by the flat-type washing brush 35 with a small amount of water continually supplied thereto, while being moved at a rate of several tens mm/min. to several hundreds mm/min.

At the time of water washing, the flat-type washing brush 35 or a rotation washing brush is moved reciprocally or in rotation for several minutes, e.g., 3 minutes, together with wash water of ordinary temperature, thereby removing or washing out a yet-uncured resin portion of the photosensitive resin layer 24 from the cured resin surface of the relief image 32 and the back deposit layer 33. The amount of thus-removed material resin of the non-cured portion corresponds to the relief depth, and is far less compared with that in the conventional case. For this reason, the number of soil removal works is reduced, and thus reducing damages to minute characters. Moreover, the frequency of wash water exchange can be decreased, and the washing treatment can be performed for a short time, thus leading to an increased plate-making speed and reduced cost for disposition of waste liquid. The water washing can be carried out with a continual supply of a small amount of wash water of ordinary temperature at a rate of 3-6 liter/min. for washing the plate material 21, thereby enhancing the outstanding environmental nature unique to a water development type plate material.

After carrying out separation removal of the uncured resin of the photosensitive resin layer 24 and removing it from the hardened resin (relief part) surface, an aqueous developer is uniformly sprayed onto the whole plate surface at a desired hydraulic pressure if needed, to complete the water development step. The aqueous developer is used in order to promote the separation removal of unreacted uncured resin, and may be a liquid capable of dissolving or swelling uncured resin. The photosensitive resin photocured (i.e., solidified by exposure to light) loses its solubility or swellability within a developer, and acquires a chemical resistance against the developer. Using this property, the relief image 32 and the back deposit layer 33 excellent in the physical characteristic (strength) can be formed on and integrally with the film base 26, to provide a flexible photosensitive resin relief printing plate 27 having a base thickness below 1 mm, preferably 820 µm-460 µm.

[Heating-Drying Step]

The photosensitive resin relief printing plate 27A after washing with water is then heated and dried with the drying heater 36 as shown in FIG. 11(F), to be free from water drop adhering to the resinous relief printing plate 27A. The photosensitive resin relief printing plate 27A after the drying step is subjected to post-exposure, comprising exposure from active light sources, such as ultraviolet fluorescence light and a high-pressure mercury-vapor lamp. In the post-exposure step with main purposes of promoting mechanical and physical strength and removing surface tackiness of the photosensitive resin relief printing plate 27A, actinic light is irradiated to the cured resin after the development from an actinic light source of a wavelength range of about 300 nm or longer. The post-exposure is performed in an atmospheric environment.

In the production of the resinous relief printing plate 27, the washing with water in the aqueous development step, drying and post-exposure may be carried out by using an environment-conscious processor (not shown), for example, known by product names of FTP965 and FTP640, available from Fuji Photo Film Graphic Systems Incorporated. Thus, the flexible resinous relief printing plate 27 is manufactured.

The thus-produced elongated resinous relief printing plate 27 is provided with marks for pin feed holes formed at both sides (marginal zones 34) in the width direction in a longitudinal direction at an even pitch of, e.g., ½ inch. The marks for pin feed holes of the resinous relief printing plate 27 are formed simultaneously with the relief image at the time of forming the relief image 32 and the platemaking by back exposure by the relief exposure using the negative film 28 and the back exposure using the positive film 29.

By making pin feed holes 37 in the produced elongated resinous relief printing plate 27 by some hole-making means, the pin feed holes 37 are formed in rows along both side zones (marginal zones 34) of the resinous relief printing plate 27 at an even pitch of, e.g. ½-inch in the longitudinal direction.

Thus, the elongated resinous relief printing plate 27 is integrally provided with the printing surface (plate surface) including the relief image and the marks for pin feed holes formed in the marginal zone 34 by simultaneous printing through the negative film 28, so that the positional alignment of the relief image 32 of the pin feed holes 37 of even pitch formed in the marginal zone 34 and the printing surface is performed correctly.

[Production of an Endless Belt-Shaped Resinous Relief Printing Plate]

The elongated flexibility resinous relief printing plate 27 is produced from the photosensitive resin plate material 21 through production steps shown in FIGS. 2(A)-2(F). The flexible resinous relief printing plate 27 is produced in an elongated slender belt shape by selecting plate materials 21 for photosensitive resin relief plate having lengths of 5-9 m and widths of 45-51 cm. The production of the endless belt-shaped printing plate 13 from the elongated resinous relief printing plate 27 is actually performed at the time of attachment to the printing apparatus 10.

Figure 3:
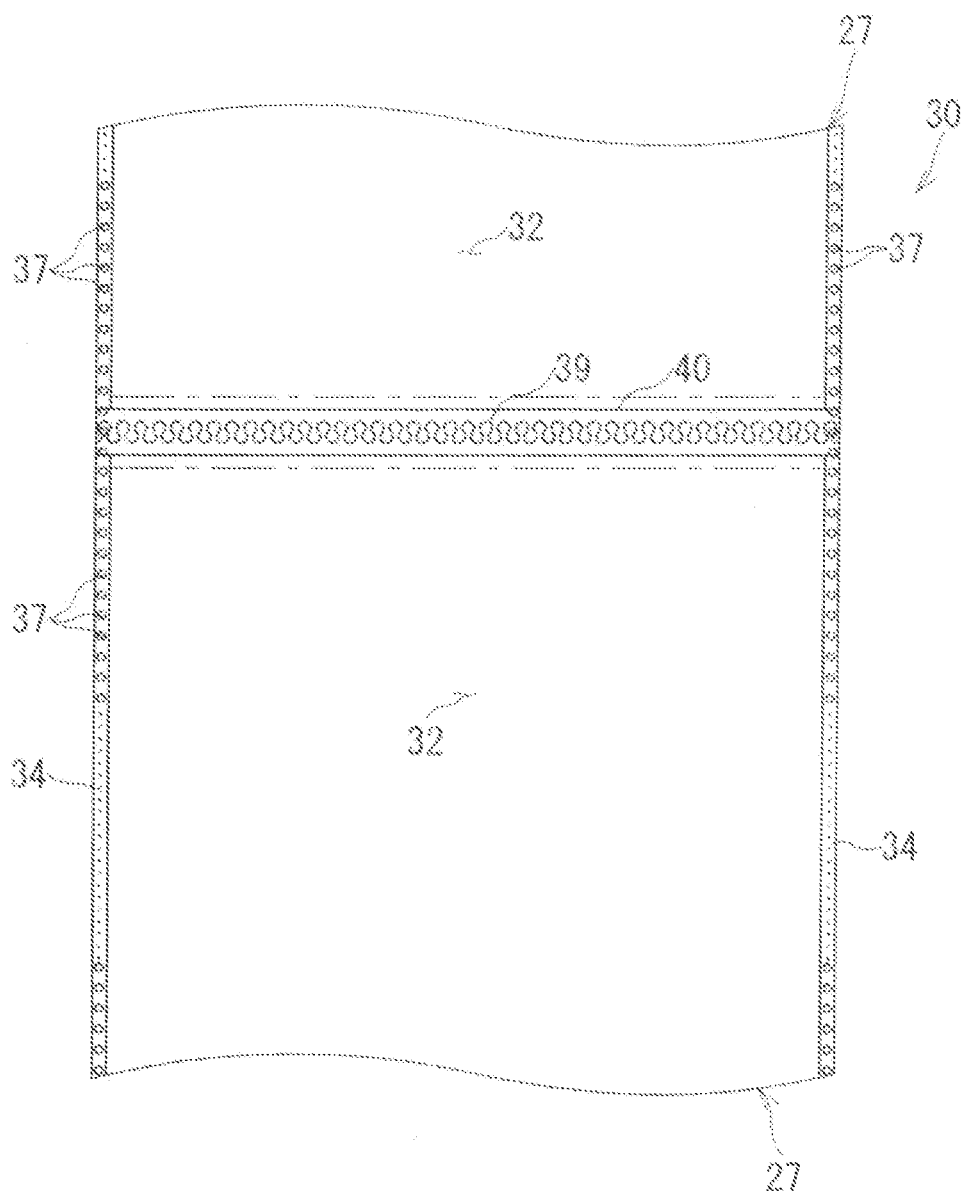
FIG. 3 illustrates a manner of joining both ends of a resinous relief printing plate or a manner of joining plural belt-like resinous relief printing plates (series connection), each prepared through a process illustrated by FIG. 2.

On the other hand, both longitudinal ends of the produced resinous relief printing plate 27 are cut into uneven shapes, as shown in FIG. 3, along the width direction by an appropriate cutting equipment. The uneven shapes given to both ends of the flexible resinous relief printing plate 27 may be any shapes allowing concavo-convex engagement with each other along the printing plate width direction, such a saw-teeth shape, a gear teeth profile, and a zigzag pattern. The uneven shapes of both ends of the resinous relief printing plate 27 are engaged with each other to form a concavo-convex joint, binding or junction 39. A one-side adhesive tape 40 is applied onto only an external surface (plate surface) side of the concavo-convex junction 39, to unite the both ends, thereby making endless the resinous relief printing plate 27 to form an endless belt-shaped printing plate 13. By abutting and engaging both ends of the resinous relief printing plate 27 to form a concavo-convex binding, the relative slide or displacement in the width or axial direction of the concavo-convex joint part (concavo-convex junction) 39 can be surely regulated and prevented.

The inner surface (film base surface) side of the concavo-convex junction 39 of the endless belt-shaped resinous relief printing plate 13 is formed with the exposed film base 26 and is formed in a flush joint condition without a tape level difference side due to application of the adhesive tape 40. The external surface (circumferential surface) side of the endless belt-shaped resinous relief printing plate 13 is provided with a plate surface 41 of the concavo-convex (relief) image as a printing surface having a relief image 32.

The uneven shapes at both longitudinal ends of the flexible resinous relief printing plate 27 are abutted to and engaged with each other, and an adhesive tape 40 is applied over the resultant concavo-convex junction 39 on the plate surface 41 having the relief image 32 to form an endless belt-shaped resinous relief printing plate 13 as an endless elongated printing plate. As shown in FIG. 1, the endless belt-shaped resinous relief printing plate 13 is wound about the plate cylinder 18 on the drive side which forms a plate cylinder (or main cylinder) of a rotary press-type relief printing apparatus and the guide cylinder 19 on the driven side.

One-round longitudinal length of the endless belt-shaped resinous relief printing plate (endless belt-shaped printing plate) 13 is suitably chosen between several meters to several tens of meters. For obtaining a longitudinal length of the endless belt-shaped resinous relief printing plate 13 is as long as several tens of meters, plural sheets of the flexible resinous relief printing plate 27 may be arranged in a longitudinal series and successively connected to form a belt-shaped sequence. Adjacent ends of an adjacent pair of the relief printing plates 27 in the belt-shaped sequence are successively joined one-by-one in the form of the above-mentioned concavo-convex junction, and both ends of the connected series of the relief printing plates 27 are finally joined together to form the endless belt-shaped resinous relief printing plate (endless belt-shaped printing plate).

[Handling of the Endless Belt-Shaped Resinous Relief Printing Plate]

The thus-formed endless belt-shaped resinous relief printing plate (endless belt-shaped printing plate) 13 is wound about the plate cylinder 18 and the guide cylinder 19 of the printing apparatus 10. (A separate description will be made later about the attachment to the printing apparatus 10 of the resinous relief printing plate 13.) Movement of the thus-wound endless belt-shaped resinous relief printing plate 13 is guided by engagement of the feed pins 43 of the plate cylinder 18 on the drive side with the pin feed holes 37 of the printing plate 13 one by one. With rotation of the plate cylinder 18, the longitudinal pin feed holes 37 bored in rows at both ends in the width direction of the endless belt-shaped printing plate 13 are engaged one by one with the feed pins 43 of the plate cylinder 18, so that the slide and displacement in the longitudinal direction and the circumferential of the endless belt-shaped printing plate 13 are regulated and prevented.

The plate cylinder 18 and the impression cylinder 17a of the printing apparatus 10 are each formed as a pure solid (steel) cylinder with a substantial weight. The plate cylinder 18 and the impression cylinder 17a in the form of a solid cylinder may be formed by machining, as by filing, which allows easy formation of a true circular section leading to good rotation balance.

The plate cylinder 18 and the impression cylinder 17a in such a solid form have a large weight and rotate with a large inertia, so that they are less liable to cause irregular movement, such as bounding or shaking, in repulsion to a printing pressure at the time of printing, and the solid cylinders formed with a true circular section by machining are provided with a good rotation balance. Moreover, as the use of a double-sided adhesive tape for attachment of is obviated, a substantial thickness unevenness due to a double-sided adhesive tape does not arise. Therefore, in solid image printing or half tone dot printing, no change or fluctuation of printing pressure is caused to results in a well-spread solid image or soil-free halftone image. Moreover, the solid cylinders are less liable to bend, so that a solid image can be beautifully printed without crushing dots even in the case of printing a solid image and a halftone dot image in mixture.

Furthermore, since the printing size of the continuous form 12 is determined by the length of the printing plate surface of the endless belt-shaped printing plate 13 instead of the circumference of a plate cylinder 16, the necessity of exchange of the plate cylinder 16 is remarkably lessened. In printing by the printing apparatus 10 using the endless belt-shaped printing plate 13, the slide or displacement of the printing plate 13 relative to the plate cylinder 18 does not occur in the longitudinal direction or width direction. For attachment of the resinous relief printing plate (printing plate) 13 to the printing apparatus 10, the use of a double-stick tape is unnecessary, and the endless belt-shaped plate 13 can be produced only by applying a one side adhesive tape 40 from the relief image 32 side to the concavo-convex joint (junction) part 39 as shown in FIG. 3.

Therefore, the thickness unevenness of the adhesive tape 40 does not occur on the cylinder surface 18S of the plate cylinder 18 carrying the endless belt-shaped printing plate 13, and even if the ends of the resinous relief printing plate 13 are connected to provide an endless form, the terminal ends of the film base 22 forming the connection area of the endless resinous relief printing plate 13 are made flush with each other. For this reason, even in a printing operation using the resinous relief printing plate 13 of the endless belt-shaped by the printing apparatus 10, it is possible to effect printing of microscopic characters down to 0.3 point, and also half tone dot printing or photograph printing of up to screen lines of 300 lines (L).

Furthermore, the printing apparatus 10 can provide background design (or pattern) or hidden characters (characters which cannot be read with naked eyes), and also print products with enhanced security, thus providing relief printing technology with improved security.

Figure 4:
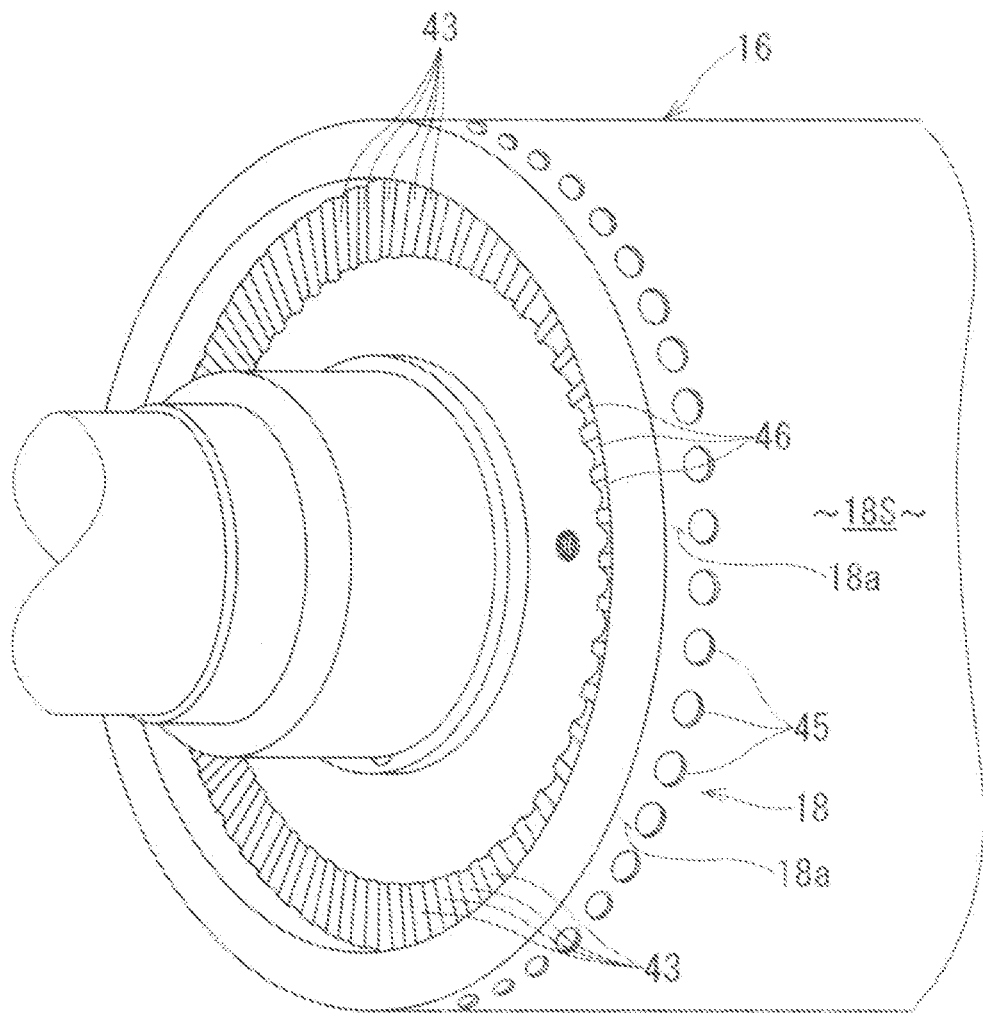
FIG. 4 is a perspective view showing a plate cylinder as viewed from its axial end side after removing a fixed cam lid and feed pins.

As shown in FIG. 4, the plate cylinder 18 (16) is provided with sleeve-shaped or tubular flange 18a formed integrally therewith at both ends in the axial direction (extended parts) thereof, and pin holes 45 are formed in a circumferential direction at an even pitch in the flanges 18a on both sides. The pin holes 45 are formed by mechanical boring. The pin holes 45 of the plate cylinder 18 are formed at an even pitch equal to the pitch of the pin feed holes 37 prepared along both ends in the width direction (marginal zones 34) of the resinous relief printing plate 27.

Figure 5:
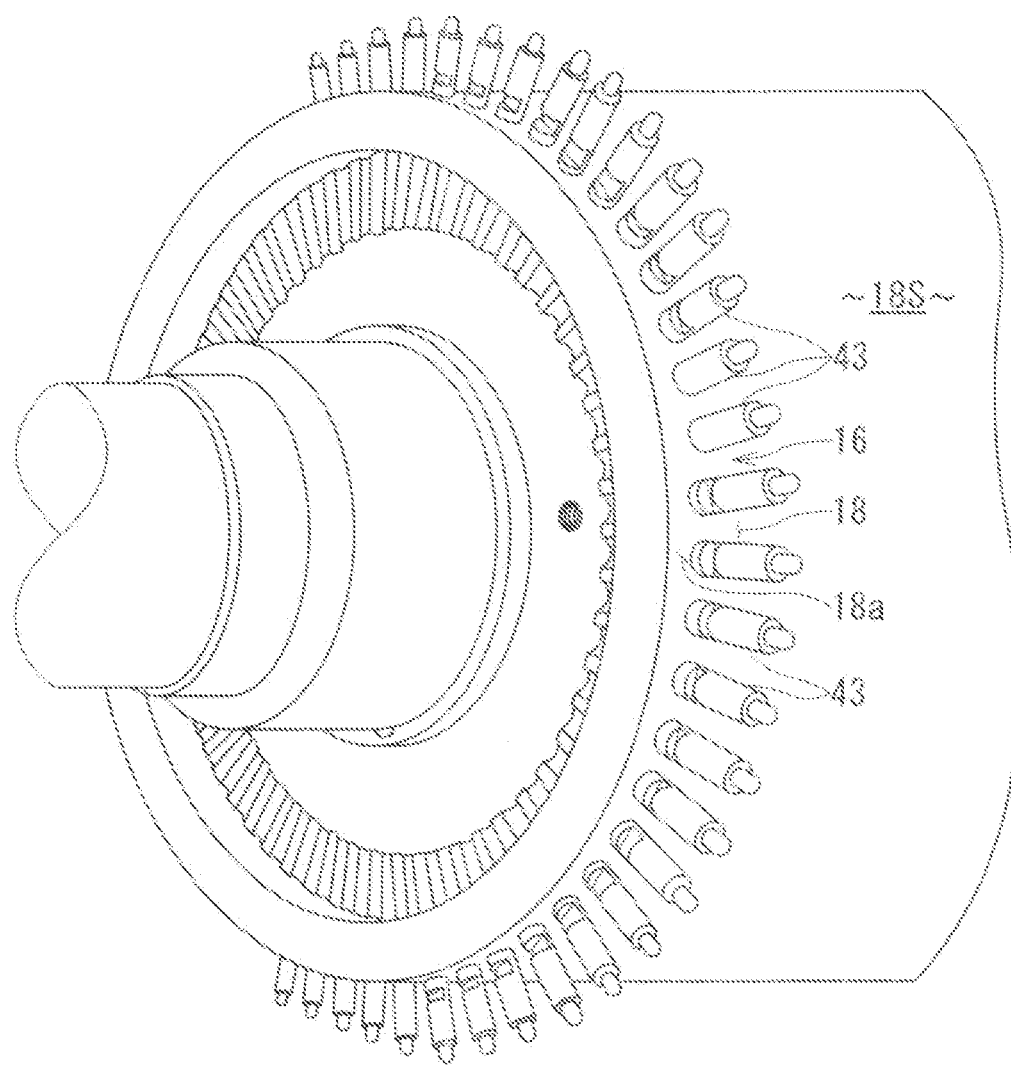
FIG. 5 is a perspective view showing a manner of attaching feed pins to an end of the plate cylinder.

Feed pins 43 are disposed in the pin holes 45 prepared in the flanges 18a of the plate cylinder 18, so as to freely project and retract. As shown in FIG. 5, each feed pin 43 projects and retracts within the cylindrical flange 18a, while being guided by radial guide slots 46 prepared in an edge face of the plate cylinder 18. Each feed pin 43 is stored in a radial guide slot 46 in the end face of the plate cylinder 18, and the guide slots 46 are radially formed in an extension direction of an associated pin hole 45. Therefore, the respective feed pins 43 are arranged along the end face of the plate cylinder in a circumferential direction, and are disposed radially so as to freely project and retract.

Figure 6:
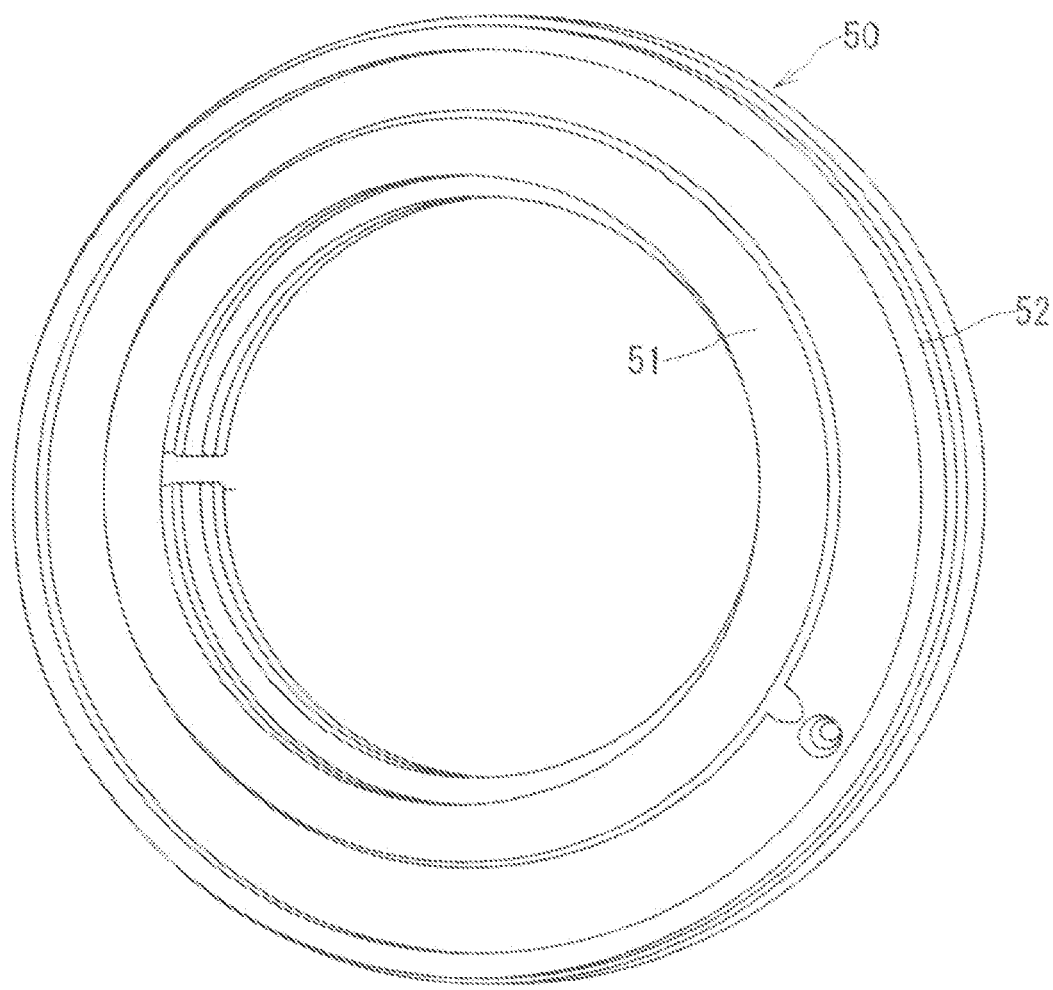
FIG. 6 is a perspective view showing a fixed cam lid disposed at an end of the plate cylinder.

The respective feed pins 43 disposed radially in the pin holes 45 (which are formed in rows in the circumferential direction in the sleeve-like flange 18a of the plate cylinder 18) are pressed down from the outside by a (ring- or washer-shaped) pin control 51 of a fixed cam lid 50 shown in FIG. 6, so that the falling-down of the feed pins 43 is prevented. The cam lid 50 is non-rotatably fixed so as to cover both ends in the axial direction of the plate cylinder 18 (16). The cam lid 50 is fixed so as not to follow the rotation of the plate cylinder 18.

Figure 7:
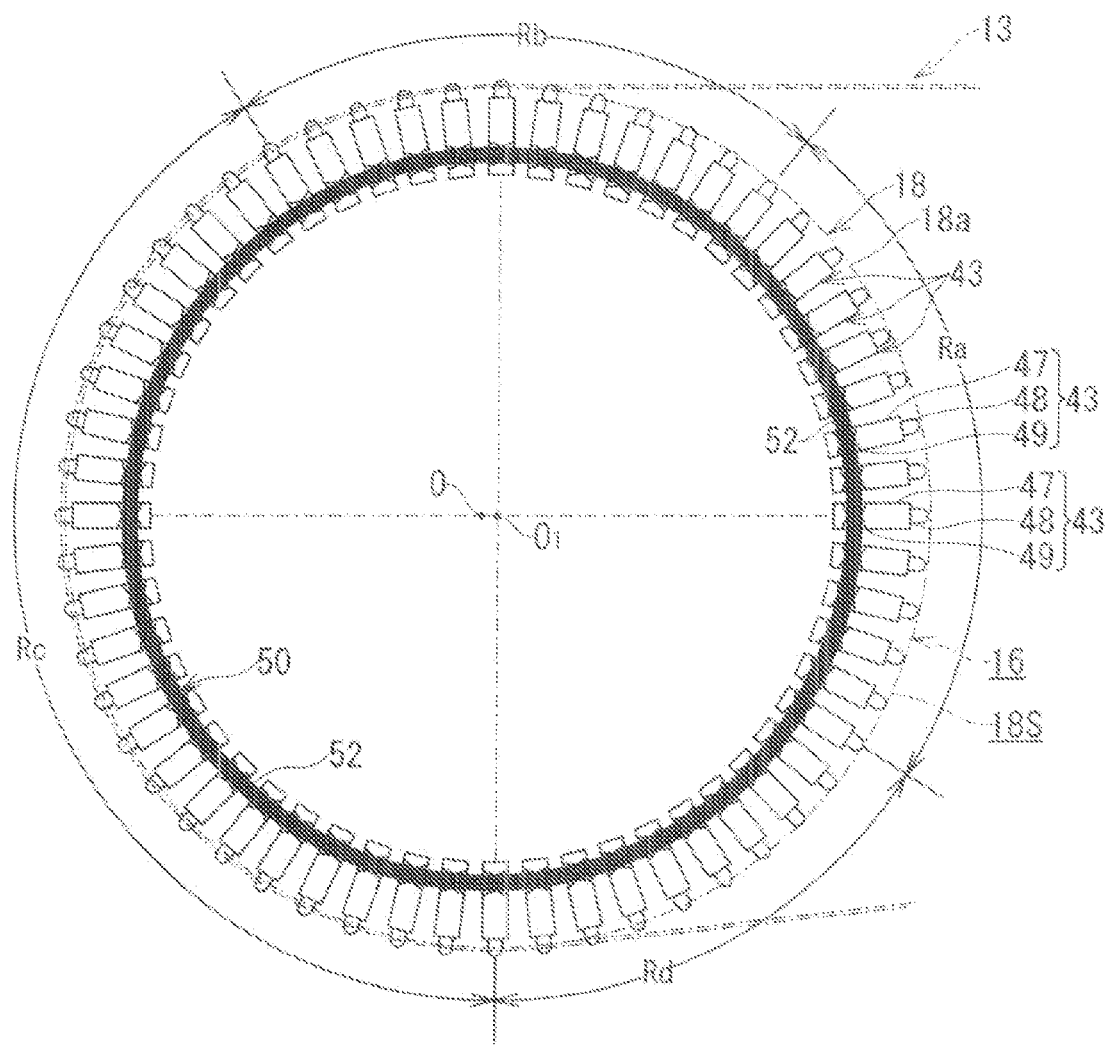
FIG. 7 illustrates a state of relative engagement between feed pins disposed in the plate cylinder and an endless belt-shaped printing plate in the printing apparatus.

Each feed pin 43 has integrally a pin body 47 in the shape of a rod or a cylinder, a pinhead 48 formed at a tip, and a cam slot (slide slot) 49 formed in the middle of the pin body 47, as shown in FIG. 7. The cam slot 49 of the feed pin 43 is engaged slidably with a cam ring 52 of the fixed cam lid 50. The cam ring 52 is formed with a diameter which is somewhat smaller than an outside diameter of the plate cylinder 18a, and also has a center $O_1$ which is a little shifted from the rotation center O of the plate cylinder 18 in a direction opposite from the guide cylinder (cam roller) 19.

The feed pins 43 are disposed at both ends (in flange-like sleeves 18a) of the plate cylinder 18, and circle (rotate) integrally with rotation of the plate cylinder 18. On the other hand, the cam ring 52 of the fixed cam lid (fixed cam) 50 is fixed with its center $O_1$ which is a little shifted from the rotation center O of the plate cylinder 18 in a direction opposite from the guide cylinder 19.

As a result of the above-mentioned arrangement, with rotation of the plate cylinder 18, the feed pins 43 are slid relative to and guided by the cam ring 52 of the cam lid (fixed cam) 50, circle (rotate), and project and retract with respect to the cylinder surface S of the plate cylinder 18. Grease, etc., may be applied so that the slide of the feed pin 43 relative to the cam ring 52 may be performed smoothly. As shown in FIG. 7, during one rotation of the plate cylinder 18, each feed pin 43 passes through a region Ra in which its pinhead 48 retreats from the cylinder surface S of the plate cylinder 18, a region Rb in which its pinhead 48 gradually projects from the cylinder surface S or 18S of the plate cylinder 18, a projection region Rc in which its pinhead 48 completely projects out of the cylinder surface S and a region Rd in which its pinhead 48 gradually retreats relative to the cylinder surface S, and then the feed pin 43 successively repeats the cycle of passing through the regions Ra, Rb, Rc and Rd for each one rotation of the plate cylinder 18. The feed pins 43 are disposed in the plate cylinder 18 at an even pitch equal to the pitch of the pin feed holes 37 of the endless belt-shaped resinous relief printing plate (endless belt-shaped printing plate) 13.

The projection region Rc of the feed pin 43 forms an angle of about 150 degree or more in terms of a central angle of the plate cylinder 18, as shown in FIG. 7, and the feed pins 43 are engaged with the pin feed holes 37 of the endless belt-shaped printing plate 13 at least in the range in which the plate cylinder 18 (16) contacts the impression cylinder 17a, whereby the slide or displacement of the printing plate 13 in the axial direction (longitudinal direction) or the width direction are securely prevented.

Incidentally, the guide roller 19 is a driven roller (cylinder), and is supported freely rotatably. The guide roller 19 is supported movably toward and away the plate cylinder 18 (16) by a position adjustment device (not shown), thereby allowing simple and easy adjustment of the tension of the endless belt-shaped printing plate 13. The endless belt-shaped printing plate 13 does not necessarily require a tension roller, etc. between the plate cylinder 18 (16) and the guide roller 19.

Thus, the plate cylinder 18 (16) equipped with the feed pins 43, and the endless belt-shaped printing plate 13 is wound about the plate cylinder 18 (16) and the guide cylinder 19. Moreover, the plate cylinder 18 (16) and the impression cylinder 17 are installed opposite to each other, whereby the rotary press type printing apparatus 10 is assembled.

[Test of an Endless Belt-Shaped Resinous Relief Printing Plate (Endless Belt-Shaped Printing Plate)]

An elongated flexible resinous relief printing plate 27 was prepared by using FUJI TORELIEF WF95BII as a plate material 21 for a photosensitive resin relief printing plate, and tested.

The plate material 21 has a plate thickness of 950 µm and includes a base film 22, an adhesives layer 23, and a photosensitive resin layer 24 of which the thicknesses are 188 µm, 32 µm and 730 µm, respectively. The plate material 21 of a photosensitive resin relief printing plate is irradiated with ultraviolet radiation (315 nm-400 nm) (UV) through production steps shown in FIG. 2, to produce a flexible resinous relief printing plate 27.

In the exposure step shown in FIG. 2(C), the plate material 21 is exposed from its front surface side to ultraviolet radiation of 520 mJ/cm² through a negative film 28 as a platemaking film within a lamphouse of an exposure device 30, to effect several times, e.g., 5 times, of printing. The photosensitive resin layer 24 of the plate material 21 has a characteristic of being not solidified below a certain light quantity, e.g., below 25 mJ/cm² and requires a large quantity of ultraviolet radiation for solidification by penetration through a thickness of 730 µm of the photosensitive resin layer 24, especially for a half tone dot of a small area.

In an ordinary operation in a lamphouse of an exposure device 30, plate making is performed by irradiation with ultraviolet radiation at an exposure quantity of 1500 mJ/cm²-2000 mJ/cm² (15-16 steps in terms of step guides). In such an instance, small halftone dots in a highlight region, e.g., halftone dots of 175 lines (L) or more of the plate material 24 are not formed due to insufficient exposure, or even if formed, such small dots are liable to be broken or lost during the development (washing out) in the making (of a resinous relief printing plate). However, if the exposure quantity is increased in order to compensate the shortage of light exposures of the half tone dot of a highlight part, the light exposure of a shadow part will become excessive to result in a solid image.

On the other hand, when a shadow part of the plate material 21 is irradiated with ultraviolet radiation at a small light quantity level of 500 mJ/cm² for example, a non-image part of a size equivalent to that of the negative film 28 is deeply formed in the photosensitive resin layer 24, but the non-image part is liable to become small and shallow as the quantity increases. In case of trying to produce an optimum resinous relief printing plate 27 capable of printing faithful to the negative film 28, a highlight part and a shadow part have mutually contradictory characters with respect to exposure quantities. A highlight part requires a large quantity of light, whereas a shadow part becomes foggy to approach a solid image at a large light quantity, so that satisfaction of good images of both types in combination has been considered impossible.

The resinous relief printing plate 27 has a small thickness of 1 mm or less, so that it can provide a printing plate faithful to the negative film 28 as a plate making film.

In order to form the flexible resinous relief printing plate 27, the plate material 21 is exposed from its front side to a small quantity of about 500 mJ/cm² as a printing exposure (relief exposure) through the negative film 28 as shown in FIG. 2(C) so that the shadow part of the plate may not receive excessive quantity of light. Then, the plate material 21 is reversed, and as shown in FIG. 2(D), the plate material 21 is exposed from its back side (film base 26 side) to ultraviolet radiation at a small light quantity of 35 mJ/cm²-70 mJ/cm², preferably 35 mJ/cm²-50 mJ/cm², through a positive film 29 or over an entire area without such an positive film 29, to effect a back exposure. As a result, a portion of the photosensitive layer 24 having a thickness of 180 µm-600 µm, preferably about 180 µm-400 µm, on the base film 22 in the plate material 21, is solidified, as denoted by Examples 1-13 in FIG. 9, to form a back deposition layer (back solidification layer) 33 in the plate product 27.

Figures 9A, 9B:
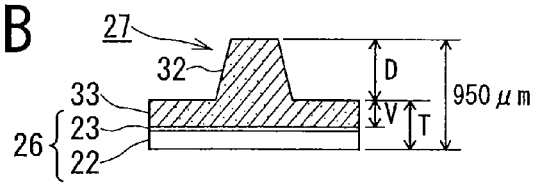
FIG. 9(A) is a table showing experimental data obtained by varying back light exposure (quantity) applied to the plate material of a photosensitive resin relief printing plate, and FIG. 9(B) illustrate a plate thickness T, a residual resin quantity V, and a relief depth D of a manufactured resinous relief printing plate.
Figure 10:
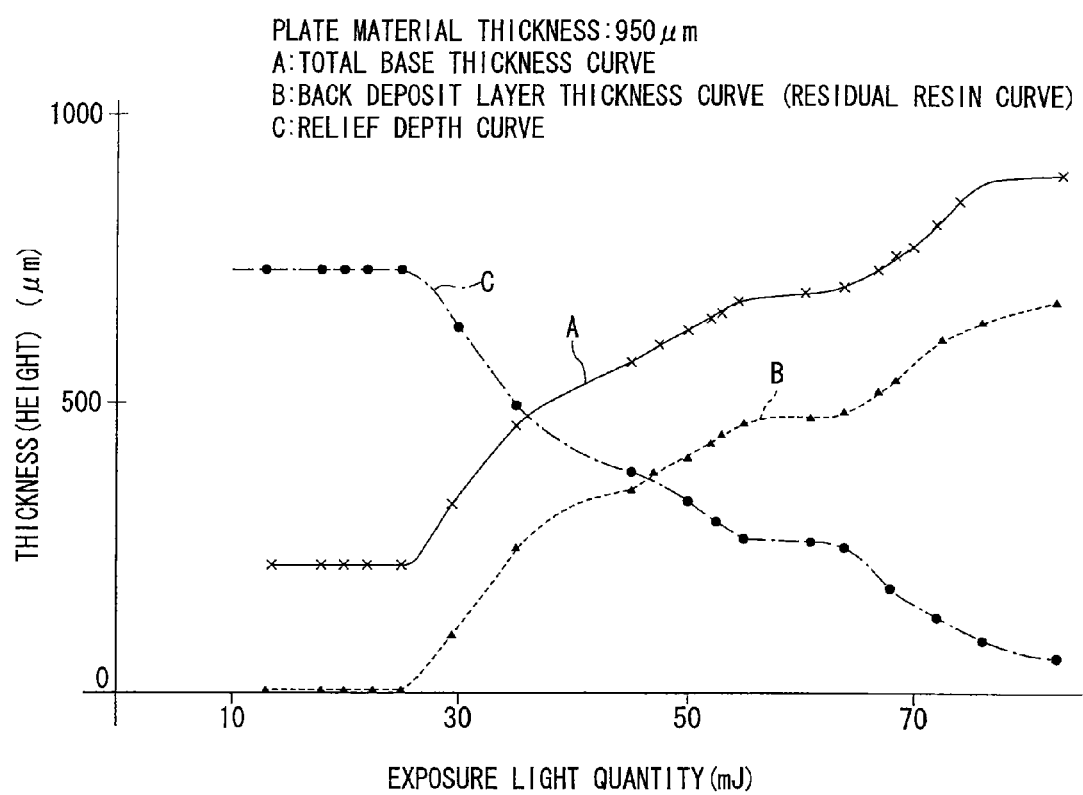
FIG. 10 is a diagram showing a plate thickness curve A, a back deposit layer thickness curve B and a relief depth curve C based on plots of the experimental data shown in FIG. 9(A) of the resinous relief printing plate (printing platemaking).

Table of FIG. 9A indicates experimental data obtained in back exposure of exposing a plate material having a thickness of 950 µm from its film base 26 (back) side with different quantities of ultraviolet radiation and shows a relationship among a back exposure quantity (average of three times) O, a total base thickness T of the product plate 27, a residual resin quantity (thickness of back deposition layer 33) V and a relief depth (relief height) D with reference to FIG. 9(B). FIG. 10 is a graph showing plots of experimental data of FIG. 9 (A). FIG. 10 shows a curve A representing the overall base-thickness of the product plate (resinous relief printing plate 27), a dashed line (dotted line) B representing the resin residual quantity (the thickness of the back deposition layer of the product plate), and a dot-and dash line C representing the relief depth (relief height) of the product plate.

With reference to the experimental data obtained by using a plate thickness of 950 µm of the plate material 21 shown in FIG. 9A, Comparative Examples 1-6 show a small photopolymer residual (solidified) quantity at back exposures below about 30 mJ/cm², giving a thin back deposit layer 33 thickness of 100 µm or less which is liable to be torn or broken. Moreover, if the back deposit layer 33 thickness is 100 μm or less, the bridging between relief images is not sufficient, and the relief images on the plate surface are only weakly reinforced mechanically and physically. Furthermore, if the back deposit layer 33 thickness is less than 130 μm, the relief depth becomes 600 μm or more, thus resulting in relief images which fail to form independent dots and are liable to fail in providing clear images due to flexure and distortion. Further, as the relief depth becomes larger, the printing reproducibility of character images and image (character) formability become worse, resulting in unsatisfactory balance. Further, at a back deposition layer 33 thickness of 100 μm or less, the solidified back deposition layer is liable to be broken or fail to show a sufficient relief image strength, thus leading to inferior image reproducibility.

On the other hand, if the back exposure quantity exceeds 72 mJ/cm$^2$ as shown in Comparative Examples 7-9 of FIG. 9(A), the relief depth becomes less than about 130 μm, while the thickness of the back deposit layer 33 becomes 600 μm or more, thus giving a sufficient pressure resistance at the time of printing. However, in an ordinary relief printing apparatus, the relief depth becomes 100 μm or less, so that clear and beautiful printing becomes difficult. In this case, since the concave portion without the concavo-convex image on the plate is as shallow as the relief depth of about 100 μm or less, the ink from the ink rollers (attaching rollers) 20 (as shown in FIG. 1) is liable to adhere to printed matter, thus resulting in soiled printed matter.

However, in the quantity of light of back exposure, as shown in the cases of Examples 1-13 in FIG. 9(A), if an exposure light quantity in the range of about 35 mJ/cm$^2$ about 72 mJ/cm$^2$ is applied, the back deposit layer 33 of the plate material 21 is exposed and solidified in a thickness of 240 μm-600 μm on a film base side.

Particularly, in case where after printing the negative film 28 onto the front side of the plate material 21 at a small exposure quantity on the order of 500 mJ/cm$^2$ as shown in FIG. 2(C), and then the plate material 21 is exposed through a positive film 29 disposed on the backside as shown in FIG. 2(D) at an exposure light quantity of about 35 mJ/cm$^2$-72 mJ/cm$^2$ on the whole surface, the plate material 21 is exposed and solidified in a thickness of 180 μm-600 μm on a film base, thus resulting in a back deposit layer 33 of 180 μm or more on the film base 26. The thus-formed solid back deposit layer 33 provides bridges between the relief images 32 to reinforce the relief images 32 having a relief depth D of 500 μm-130 μm. Moreover, the relief images 32 are integrated with the film base 26 and are reinforced with the back deposit layer 33, so as to form a tapered shape enlarging in diameter toward the film base 26 (as shown in FIGS. 2(C) to 2(F)).

In this way, if a relief exposure of about 500 mJ/cm$^2$ is performed through the negative film 28 from the front side of the plate material 21, and then back exposure is performed with a prescribed quantity through a positive film 29 or directly without such a positive film 29 from the back side of the plate material 21, the resultant relief images 32 are reinforced with the back deposit layer 33 (of 180 μm-600 μm), and the relief images 32 remain in a relief depth range of 500 μm-130 μm. Since the remaining relief images 32 remain in a shallow depth of 500 μm-130 μm, and relief depth are shallow, most small independent spots are restored to result in a printing plate (resinous relief printing plate 27) capable of providing even a shadow image part which is substantially faithful to the negative film 28.

The printing light quantity on the front side of the plate material 21 can be reduced to ⅓-¼ of an ordinary quantity (1500 mJ/cm$^2$-2000 mJ/cm$^2$) and also the time and amount of water required in the washing step can be reduced to ⅓ or less of those in the conventional process, thus allowing production of a resinous relief printing plate 27, which is friendly to environments and give less ecological loads.

By carrying out relief exposure through a negative film 28 from the front side of the plate material 21, and then performing back exposure through a positive film 29 or directly without such a positive film from the back side, it becomes possible to provide a good balance of a highlight image and a shadow image, which has been impossible to achieve in the conventional resinous printing plates.

Moreover, by carrying out relief exposure through a negative film 28 at an exposure on the order of 500 mJ/cm$^2$ from the front side of the plate material 21, and then performing back exposure through a positive film 29 at a small exposure of 35 mJ/cm$^2$-72 mJ/cm$^2$ from the front side for production of a flexible resinous relief printing plate 27, it becomes possible to supply from the backside a large quantity of light to a highlight portion including independent spots to which only a weak light is supplied from the front side, thereby forming a reinforcing back deposit layer, and also supply only a small quantity of light to the shadow part. As represented by Examples 5-13 in FIG. 9(A), the back exposure light quantity is preferably about 35 mJ/cm$^2$-about 72 mJ/cm$^2$.

The shadow part of the plate material 21 formed after back exposure through the positive film 29, is formed of required small half tone dots free from collapse, due to sufficient solidification of the photopolymer. The thus-formed half tone dots are reinforced mechanically and physically by bridges formed by back exposure, thereby providing a shadow part which is composed of half tone dots free from collapse and can be as bright as given by the negative film 28.

Moreover, when the back exposure light quantity is 50 mJ/cm$^2$-68 mJ/cm$^2$, the individual spots of the half tone dots are bridged with a back deposit layer 33 solidified from the film base 26 at a thickness of about 400 μm-about 500 μm, and the relief image 32 is formed with a relief depth of about 200 μm-about 330 μm, so that the low relief image is provided with an increased pressure resistance and can provide clear images composed of fine micro-characters or photographic images with good reproducibility.

The elongated resinous relief printing plate 27 is formed of a soft plate material 21 with a Shore A hardness of about 30 to 40, through back exposure by applying a light quantity of 35 mJ/cm$^2$-68 mJ/cm$^2$, preferably 50 mJ/cm$^2$-68 mJ/cm$^2$ as shown in FIG. 2(C), so that the back deposit layer 33 is formed with an increased thickness from the film base 26. Therefore, the relief images 32 are provided with a small relief depth and caused to have downwardly enlarging tapers bridged with each other, thereby having improved mechanical and physical strengths. The independent spots of half tone dots are no longer separate from each other, but bridged to be integrated with each other and reinforced. For this reason, the flexible resinous relief printing plate 27 is provided with improved printing durability and pressure resistance at the time of printing and can provide halftone dots, fine micro-characters and photograph printing images, which are free form, soiling and breakage.

As experimental data, the resinous relief printing plate 27 could be used in a rotary press-type printing apparatus 10 to perform photograph printing for reproducing a combination of half tone dots of 1-99% and 100%-solid relief pattern. By the resinous relief printing plate 27, it was possible to reproduce half tone dots down to screen lines of 300 L and micro characters down to 0.4 point (pt), e.g., Chinese characters of 0.5 pt, thus having realized printing of from 1%-halftone dot to 100%-solid, without soiling of the half tone dots.

The rotary press-type printing apparatus 10 was equipped with the endless belt-shaped resinous relief printing plate (endless belt-shaped printing plate) 13 produced from the elongated flexible resinous relief printing plate 27. Printing of 300 L half tone dots and the character of 0.5 pt correspond to micro characters of 0.18 mm-size. By combining the resinous relief printing plate 27 and the rotary press type printing apparatus 10, photographic printing of 175 L-300 L in terms of screen lines, was possible.

The resinous relief printing plate 27 is a soft printing plate with a Shore A hardness of about 30 to 40. When such a soft resinous relief printing plate is mounted on a usual rotary press or a soft endless belt-shaped resinous relief printing plate is mounted by winding about a rotary press type printing apparatus for printing, a conventional printing plate is liable to cause that its first printing region is pushed aslant to the press zone at the time of printing, thus soiling the halftone dots. The resinous relief printing plate 27 of the invention is free from such a liability of soiling.

The following knowledge was acquired. At the time of exposure for producing a flexible belt-shaped resinous relief printing plate 13, if a linear region immediately preceding the printing surface of a plate material 21 in the print direction is subjected to back exposure of 50 mJ/cm$^2$-72 mJ/cm$^2$ from the back side of the plate material 21, a photopolymer is solidified in a thickness of 400 μm-600 μm to form a back deposit layer 33. As a result, a relief image 32 in the image region is caused to have a reduced relief depth of 330 μm-130 μm, whereas the non-printing region is reinforced with the back deposit layer 33 to prevent the soiling of the first printing region before occurring.

It was however found that when the relief depth of the relief image 32 was reduced to 100 μm or less, the soiling of non-image part occurred. As a further study, the following knowledge was acquired. As for the printing region of the plate material 21, if the relief depth is set to 130 μm or more, preferably 180 μm-about 330 μm, i.e., if the back deposit layer 33 is set to about 400 μm or more, by adjusting the back exposure light quantity, it becomes possible to provide a light-weight endless belt-shaped resinous relief printing plate 13, which has a plate thickness below 1 mm, more specifically, about 620 μm-about 820 μm and also can prevent background soiling.

By adjusting the back exposure quantity with half tone dot gradation to control the thickness of the back deposit layer 33 to 550 μm or less, it has become possible to provide an endless belt-shaped flexibility resinous relief printing plate 13 which shows a strong printing durability and allows soil-free relief printing.

By the way, in the relief exposure step shown in FIG. 2(C) for production of the elongated flexible resinous relief printing plate 27, while a relief image (a printing surface, a straight line part) 32 is formed on the film base 26, marks for pin feed holes are formed along both ends of the plate material 21 of a flexible resinous relief printing plate together with the relief image, by exposure through the negative film 28.

In the produced flexible resinous relief printing plate 27, the relief images 32 are formed on the film base 26 with respect to such open marks for the pin feed holes 37. For this reason, in the flexible resinous relief printing plate 27, the image region formed with relief images 32 are imposed with respect to the pin feed holes 37, so that the imposition is exactly performed. Moreover, in the endless belt-shaped printing plate 13 produced from the flexible resinous relief printing plate 27, the pin feed holes 37 are formed at an even pitch in the longitudinal direction along both sides of the plate 13, and, moreover, the pitch of the pin feed holes 37 is set equal to the pitch of the feed pins 43 prepared in the plate cylinder 18 (16).

As a result, the endless belt-shaped relief printing plate (endless belt-shaped printing plate) 13 wound about the plate cylinder 18 and the guide cylinder 19 is moved and guided, while e.g., 26 or more holes of the pin feed hole 37 formed along both sides thereof are successively engaged with the feed pin 43 of the plate cylinder 18. Accordingly, the endless belt-shaped relief printing plate is move and guided exactly without slip or displacement in the circumferential direction or width direction. For this reason, even when the elongated endless belt-shaped resinous relief printing plate 13 is installed in a rotary press-type printing apparatus 10, it becomes possible to perform Chinese character printing of, e.g., 0.4 point and half tone dot printing down to screen lines of 300 L.

Furthermore, the endless belt-shaped printing plate 13 is wound about the plate cylinder 18 and the guide cylinder 19 in the rotary press type printing apparatus 10. Since the printing plate is formed by winding the endless belt-shaped printing plate 13 around the plate cylinder 18, the exchange of the plate cylinder 16 is unnecessary, and only exchange of the endless belt-shaped printing plate 13 is required for exchanging the printing plate. The exchange is simple and easy and the time required therefor is as short as about 5 minutes. Further, adjustment of a touch roller becomes unnecessary.

Moreover, since the printing length onto a continuous form is determined by the length of the resinous relief printing plate 27 instead of the circumferential length of a plate cylinder 18 (16), exchange of the plate cylinder 18 becomes unnecessary and a spare cylinder for the exchange becomes unnecessary.

Moreover, the endless belt-shaped printing plate 13 is formed by engaging the unevenness junction 39 at both ends of the flexible resinous relief printing plate 27 and applying one-side adhesive tape 40 on the relief image 32 side of the junction 39, so that the endless belt-shaped resinous relief printing plate 13 in contact with the plate cylinder 18 is caused to have a flush surface, and neither thickness unevenness nor a tape level difference is formed. Further, since the plate cylinder 18 is formed by machining as by filing of a solid (steel) cylinder, the resultant polished plate cylinder 18 can realize excellent printing quality, even for micro printing, in combination with the endless belt-shaped printing plate 13 formed with good thickness precision.

In an ordinary relief printing apparatus, since a relief printing plate is bonded with a double-stick tape onto a cylinder, the bonded printing plate surface is caused to have a surface irregularity remarkably affecting the quality of halftone dot prints due to uneven thickness of the double-stick tape, thus failing to ensure a good printing quality.

In contrast thereto, the printing apparatus 10 of this embodiment can print micro characters of 0.4 point-0.5 point on a continuous form 12, which micro characters cannot be reproduced by copying with a copying machine due to collapse of the characters. Therefore, by using the endless belt-shaped printing plate 13 for the rotary press type printing apparatus 10, it is possible to provide a printing technology with high security capable of providing prints which are difficult to reproduce with a copying machine or can prevent forgery thereof.

For this reason, by applying the endless belt-shaped printing plate 13 which is an endless belt-shaped resinous relief printing plate to the rotary press type printing apparatus 10, much more improvement in printing precision and printing performance can be achieved, and a printing technology capable of preventing forgery and high security only by printing is provided.

Also in the case of a resinous relief printing plate 27 produced from a plate material 21 having a thickness of 1.14 mm (1140 μm), the bridge formation between relief images is not enough if the back deposit layer 33 is 100 μm or less in thickness, and mechanical/physical reinforcement of the relief image on the printing surface becomes weak. A back deposit layer 33 of 100 μm or less cannot provide a sufficient relief image strength because the solidified back deposit layer 33 is liable to be broken or torn.

Moreover, in the case of a resinous relief printing plate 27 produced from a plate material 21 having a thickness of 1.14 mm, at a small relief depth of 100 μm or less, ink from the ink roll 20 (refer to FIG. 1) adheres to printed matter to soil the printed matter, so that it is desirable to provide a height (depth) over 100 μm. In the case of using ink with a low viscosity as in the case of a resinous relief printing plate 27 for flexographic printing machines, it is preferred to use a printing plate 27 having a relief depth of, e.g., 200 μm or more, which is larger than in the relief printing machine.

[Modification of Resinous Relief Printing Plate]

FIG. 11 shows a modification of the flexible resinous relief printing plate.

Figure 2:
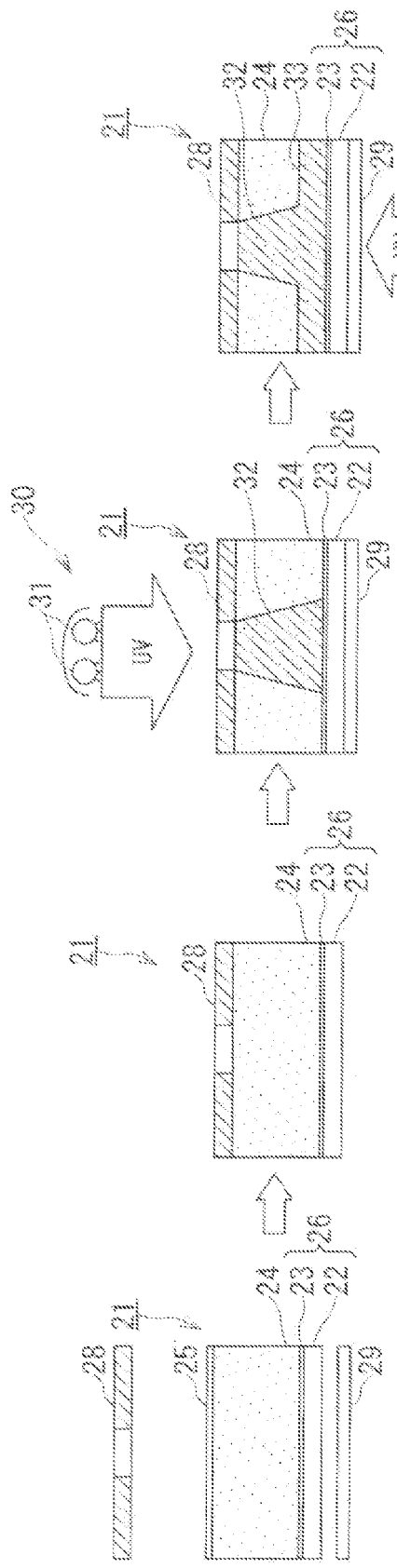
FIGS. 2A-2F show a process for manufacturing a photosensitive resin relief printing plate which constitutes an endless belt-shaped printing plate of the above-mentioned printing apparatus, in which FIGS. 2(A) to 2(F) respectively show manufacturing steps involved in the process.

A flexible resinous relief printing plate 27A shown in this modification differs from the resinous relief printing plate 27 shown in FIG. 2 only in the plate material 21A, and the other members and functions are not substantially different, so that identical members are denoted by identical numerals and the description thereof is omitted or simplified.

For production of the resinous relief printing plate 27A, a plate material 21A of CPT-type not requiring a plate-making film is used. As such a plate material 21A, "FUJI TORELIEF DWF95DT, DWF95DII, etc." are available, for example.

In the CPT plate material 21A of a photosensitive resin for relief printing plate, as shown in FIG. 11, a photosensitive resin layer 24 is integrally laminated on a base film 22 of polyester (PET) film as a substrate via an adhesives layer 23, and an ablation mask 58 reactive to infrared laser is laminated on the photosensitive resin layer 24. The ablation mask 58 constitutes a black masking layer reactive to infrared laser on the photosensitive resin layer 24, and a cover film 25 is attached on the ablation mask 58. Incidentally, the photosensitive resin layer 24 is not reactive to infrared laser.

A preferred example of the CPT plate material 21, e.g., with a plate thickness of 950 μm, includes a 188 μm-thick base film 22 a 32 μm-thick adhesives layer 23 functioning as an anti-halation layer, and a 730 μm-thick photosensitive resin layer 24 not reactive to infrared radiation, similarly as the plate material 21 shown in FIG. 2. The base film 22 and the adhesives layer 23 constitute a film base 26 as film support, and the base thickness is 220 μm.

The CPT plate material 21A of a photosensitive resin for relief printing plate is used for production of the resinous relief printing plate 27A which is a flexible printing plate.

For the production of the flexible resinous relief printing plate 27A, a positive film 29 may be provided as desired similarly as for the plate material 21A (refer to FIG. 11 (A)). The CPT plate material 21A from which the cover film 25 has been removed, is subjected to pattern exposure of the infrared laser L from the front side, to form a plate pattern in the ablation mask 58 as shown in FIG. 11(B). For the CPT plate material 21A, a negative film as a plate-making or printing film becomes unnecessary.

UV exposure of the CPT plate material 21A is carried out following the formation of the plate pattern by laser light L exposure on the ablation mask 58 (refer to FIG. 11 (C)). By performing the drawing and the UV exposure of the CPT plate material 21A in succession on a CTP plate-making machine, it becomes possible to prevent scratches due to handling of the plate material 21A.

The CPT plate material 21A conveyed to a lamphouse is irradiated with ultraviolet radiation (315 nm-400 nm) (UV) from the ultraviolet radiation light source in the lamphouse, while being moved at a prescribed speed in the lamphouse, whereby relief exposure is performed.

In the relief exposure, the photosensitive resin layer 24 of the CPT plate material 21A is irradiated with the ultraviolet radiation at a light quantity of, e.g., about 500 mJ/cm² through the plate pattern of the ablation mask 58. The portion exposed to ultraviolet radiation of the photosensitive resin layer 24 is solidified (photo-cured). By the photocuring, a relief image 32 of a character or a picture is formed in the photosensitive resin layer 24 of the CPT plate material 21A, and the relief image 32 is formed in a tapered shape which enlarges toward the base film 22.

The ultraviolet relief light exposure as printing exposure may be performed by using ultraviolet radiation at a light quantity of about 500 mJ/cm², preferably 490 mJ/cm²-530 mJ/cm², more preferably 500 mJ/cm²-520 mJ/cm². If irradiated with ultraviolet radiation at a light quantity of about 500 mJ/cm², the photosensitive resin layer 24 is provided with a relief image 32 with a relief depth of about 730 μm at an exposed part. The relief depth becomes smaller when a relief image is a small spot.

After the relief image 32 is formed in the photosensitive resin layer 24, the CPT plate material 21A is taken out from the lamphouse and is reversed, and a positive film 29 is positionally aligned with the ablation mask 58 and intimately adhered and fixed to the back side of the plate material 21A by vacuum adhesion and fixation. By the vacuum fixation, the occurrence of a position gap and adhesion unevenness between the CPT plate material 21A and the positive film 29 is prevented. A cover film of, e.g., a vinyl chloride resin, may be applied onto the positive film 29, if needed.

In this way, the CPT plate material 21A of a photosensitive resin for relief printing plate is subjected to relief pattern exposure with the drawing laser light L and the UV exposure in succession, and then taken out. The taken-out CPT plate material 21A is then reversed and, on the back side thereof, the positive film 29 is desirably affixed by vacuum fixation. Then, the plate material 21A is again introduced into the lamphouse, and back exposure is performed. In the back exposure, the plate material 21A is exposed from its base film 26 side directly or through the positive film 29 to ultraviolet radiation in a light quantity of 35 mJ/cm²-72 mJ/cm², to form a back deposit layer (back solidified layer) 33 all over the photosensitive resin layer 24 on the film base 26 side of the CPT plate material 21A (refer to FIG. 11(D)).

The back deposit layer 33 is formed all over the film base 26 side of a 950 μm-thick plate material 21A, in a thickness range of 130 μm or more and up to 600 μm, preferably 200 μm-550 μm, as a photocured (solidified) thickness portion of the photosensitive resin layer 24. The back deposit layer 33 is integrally formed with the film base 26 as the film support, to raise the mechanical and physical strength of the photosensitive resin relief printing plate 27. A thicker back deposit layer 33 provides a larger mechanical and physical strength of the plate material 21.

FIGS. 11(C) and 11(D) have shown an example wherein back exposure is performed after performing the relief exposure to the CPT plate material 21A of a photosensitive resin for relief printing plate. However, it is also possible to perform the relief exposure and the back exposure simultaneously from the front side and back side of the CPT plate material 21A, or perform the back exposure in advance of the relief exposure.

The CPT plate material 21A after the photocuring by the relief exposure and back exposure in the exposure steps is, after removing the ablation mask 58 and the positive film 29 therefrom, sent to a water washing step. In the water washing step, washing with water is performed by using a flat-type washing brush 35 installed freely slidably in a washing apparatus (not shown), to effect washing with water of ordinary temperature as shown in FIG. 11(E). In the washing with water, the CPT plate material 21A is washed by the flat-type washing brush 35 with a small amount of water continually supplied thereto, while being moved at a rate of several tens mm/min. to several hundreds mm/min.

At the time of water washing, the flat-type washing brush 35 is moved reciprocally or rotational brushing action is exerted by a rotation washing brush, for several minute, e.g., 3 minutes, together with wash water of ordinary temperature, e.g., at about 24° C.-about 25° C., thereby removing or washing out a yet-uncured resin portion of the photosensitive resin layer 24 from the cured resin surface of the relief image 32 and the back deposit layer 33. The amount of thus-removed material resin of the non-cured portion corresponds to the relief depth, and is far less compared with that in the conventional case. For this reason, the number of soil removal works is reduced, and thus reducing damages to minute characters. Moreover, the frequency of wash water exchange can be decreased, and the washing treatment can be performed for a short time, thus leading to remarkable reduction of electric power and the cost for disposition of waste liquid. The water washing can be carried out with a continual supply of a small amount of wash water of ordinary temperature at a rate of 3-6 liter/min. for washing the CPT plate material 21A, thereby enhancing the outstanding environmental characteristic unique to a water development type plate material.

After carrying out separation removal of the uncured resin of the photosensitive resin layer 24 and removing it from the hardened resin (relief part) surface, an aqueous developer is uniformly sprayed onto the whole plate surface at a desired hydraulic pressure if needed, to complete the water development step. The aqueous developer is used in order to promote the separation removal of unreacted uncured resin, and may be a liquid (tap water may be sufficient.) capable of dissolving or swelling uncured resin. The photosensitive resin photocured (i.e., solidified by exposure to light) loses its solubility or swellability within a developer, and acquires a chemical resistance against the developer. Using this property, the relief image 32 and the back deposit layer 33 excellent in the physical characteristic (strength) can be formed on and integrally with the film base 26, to provide the flexible photosensitive resin relief printing plate 27A.

The photosensitive resin relief printing plate 27A after washing with water is then heated and dried with the drying heater 36 as shown in FIG. 11(F), to be free from water drop adhering to the resinous relief printing plate 27A. The photosensitive resin relief printing plate 27A after the drying step is subjected to post-exposure, comprising exposure from active light sources, such as ultraviolet fluorescence light and a high-pressure mercury-vapor lamp. In the post-exposure step with a main purpose promotion of mechanical and physical strength and removal of surface tackiness of the photosensitive resin relief printing plate 27A, actinic light is irradiated to the cured resin after the development from an actinic light source of a wavelength range of about 300 nm-about 460 μm. The post-exposure is performed in an atmospheric environment.

In the production of the resinous relief printing plate 27A, the washing with water in the aqueous development, drying and post-exposure, may be carried out by using an environment-conscious processor (not shown), for example, known by product names of FTP640II and FTW350LII, available from Fuji Photo Film Graphic Systems Incorporated. Thus, the flexible resinous relief printing plate 27A is produced.

An endless belt-shaped resinous relief printing plate is produced from the thus-produced flexible resinous relief printing plate 27A. However, the production of such an endless belt-shaped resinous relief printing plate is not different from the production of the resinous relief printing plate (endless belt-shaped printing plate) described with reference to FIG. 3, so that the explanation is omitted.

Also for production of the resinous relief printing plate 27A as a modification, a highly efficient photopolymer of environmental adaptability and precision quality in the field of relief printing is available. Particularly, the resinous relief printing plate 27A does not necessitate a negative film as a plate-making film, and allows easy and secure printing exposure accuracy in the exposure step, so that an improved productivity is achieved. Moreover, as a plate-making film is not required, an outstanding resinous relief printing plate 27A can be produced with low environmental load.

[Attachment to the Printing Apparatus of a Resinous Relief Printing Plate]

The elongated flexible resinous relief printing plates 27 and 27A are produced from the plate materials 21 and 21A, respectively, of a photosensitive resin for relief printing plate through the production steps shown in FIGS. 2(A)-2(F) and FIGS. 11(A)-11(F), respectively. The thus-produced resinous relief printing plate 27 (27A) is provided with marks for pin feed holes at a prescribed pitch in the marginal zones 34 integrally formed with the relief images (printing surface) (refer to FIG. 3). The marks for pin feed holes of the resinous relief printing plate 27 (27A) are bored by a boring means to form pin feed hole 37 in the marginal zones 34, and both ends in the longitudinal direction of the resinous relief printing plate 27 are cut so as to form mutually complementary uneven shapes of, e.g. concave-convex pattern or zigzag pattern along a width direction.

Thus, while boring the pin feed holes 37 in the marginal zones 34 of the elongated resinous relief printing plate 27 at a predetermined pitch (for example, ½-pitch interval), both ends in the longitudinal direction of the resinous relief printing plate 27 are cut to form mutually complementary concave-convex shapes (including zigzag pattern) along a width direction Next, the resinous relief printing plate 27 formed with the pin feed holes 37 in the marginal zones 34 and uneven shapes at both longitudinal ends, is attached to the printing apparatus 10 shown in FIG. 1. In advance of the attachment to the printing apparatus 10, the guide roller 19 is somewhat moved toward the plate-cylinder 18, if needed, by using a move regulation mechanism (not shown).

Then, the elongated resinous relief printing plate 27 is inserted from the guide roller 19 side to above the plate cylinder 18 (16) so that its relief image (printing surface) 32(F) aces upward. The inserted resinous relief printing plate 27 is further introduced while the pin feed holes 37 in the marginal zones 34 thereof are engaged one by one with the feed pins 43 of the plate cylinder 18. At this time, the plate cylinder 18 is held in the state of being rotation-free.

Then, the elongated resinous relief printing plate 27 is further sent in along with the rotation of the plate cylinder 18, passed by the ink rollers 20 to be wound about the plate cylinder 18 and pulled out from between the plate cylinder 18 and the impression cylinders 17a. The front end of the pulled-out resinous relief printing plate 27 is returned to the guide roller 19 side and wound about the guide roller 19 from the lower side thereof, and then reversed and returned toward the plate cylinder 18 side.

Next, the front end of the elongated resinous relief printing plate 27 returned to the plate-cylinder 18 side is guided to the rear end thereof, and both ends in the longitudinal direction of the resinous relief printing plate 27 are engaged with each other to form a concavo-convex junction. A one-side stick adhesive tape 40 is stuck or applied from the relief image (printing surface) side over the thus-joined both ends extending in a width direction to complete the concavo-convex junction of the elongated resinous relief printing plate 27. The application of the adhesive tape 40 can be performed by utilizing the cylinder surface S of the plate cylinder 18, or with the aid of a flat-surfaced sheet (not shown).

By sticking the adhesive tape 40 onto mutually engaged both ends of the elongated resinous relief printing plate 27 along a width direction from the relief image (printing surface) 32 side, as shown in FIG. 3, the concavo-convex junction 39 is simply formed and firmly fixed at the both ends of the resinous relief printing plate, whereby an endless belt-shaped resinous relief printing plate, i.e., the endless belt-shaped printing plate 13, is formed in its place. When some pin feed holes 3'7 formed in the marginal zones 34 of the resinous relief printing plate 27 is blockaded with the adhesive tape 40 at that time, the adhesive tape 40 may be punched through for reforming the pin feed holes 37.

Next, by operating a position adjustment device (not shown), the guide roller 19 is moved away from the plate cylinder to adjust a tension acting on the endless belt-shaped printing plate 13, whereby the attachment to the printing apparatus 10 of the endless belt-shaped printing plate 13 is completed. In the printing apparatus 10, a combination of the endless belt-shaped printing plate 13 and the plate cylinder 18 corresponds to a plate cylinder (16) covered with a printing plate in an ordinary relief printing apparatus.

The printing apparatus 10 is equipped with the elongated endless belt-shaped printing plate 13 which is an endless belt-shaped resinous relief printing plate in a thickness of less than 1 mm and therefor light in weight. The movement of the endless belt-shaped printing plate 13 is guided by engagement of the pin feed holes 37 in the marginal zones 34 thereof and the feed pins 43 prepared in the plate cylinder 18, without causing slide or displacement in a longitudinal direction or a width direction, thus ensuring exact and stabilized movement free from printing unevenness.

Moreover, since the concavo-convex joint of both ends is achieved with the one side adhesive tape 40 applied from the printing surface side, and the tape level difference of the adhesive tape 40 is not formed on the base film 22 side of the endless belt-shaped printing plate 13, it is possible to obviate a printing unevenness or an adverse effect on printing precision attributable to a tape level difference.

In the endless belt-shaped printing plate 13, the relief image (a printing surface) 32 and the marks for pin feed holes 37 are formed simultaneously, and the printing surface is positionally imposed with reference to the pin feed hole 37, it becomes possible to always perform exact printing (at a printing speed of, e.g., 200 m/min.).

Furthermore, the plate cylinder 18 (16) and the impression cylinder 17a are each formed of a solid steel cylinder by machining, such as filing, with a good circularity so that these cylinders show a good rotation balance and heavy weight leading to less irregular movement affected by a printing pressure exerted in relief printing, thus ensuring exact and accurate printing. According to the printing apparatus 10, it is possible to effect micro character printing down to 0.3 pt (point) and photograph printing up to 300 lines, e.g., 175 lines, by using a relief printing plate.

Second Embodiment

Figure 12:
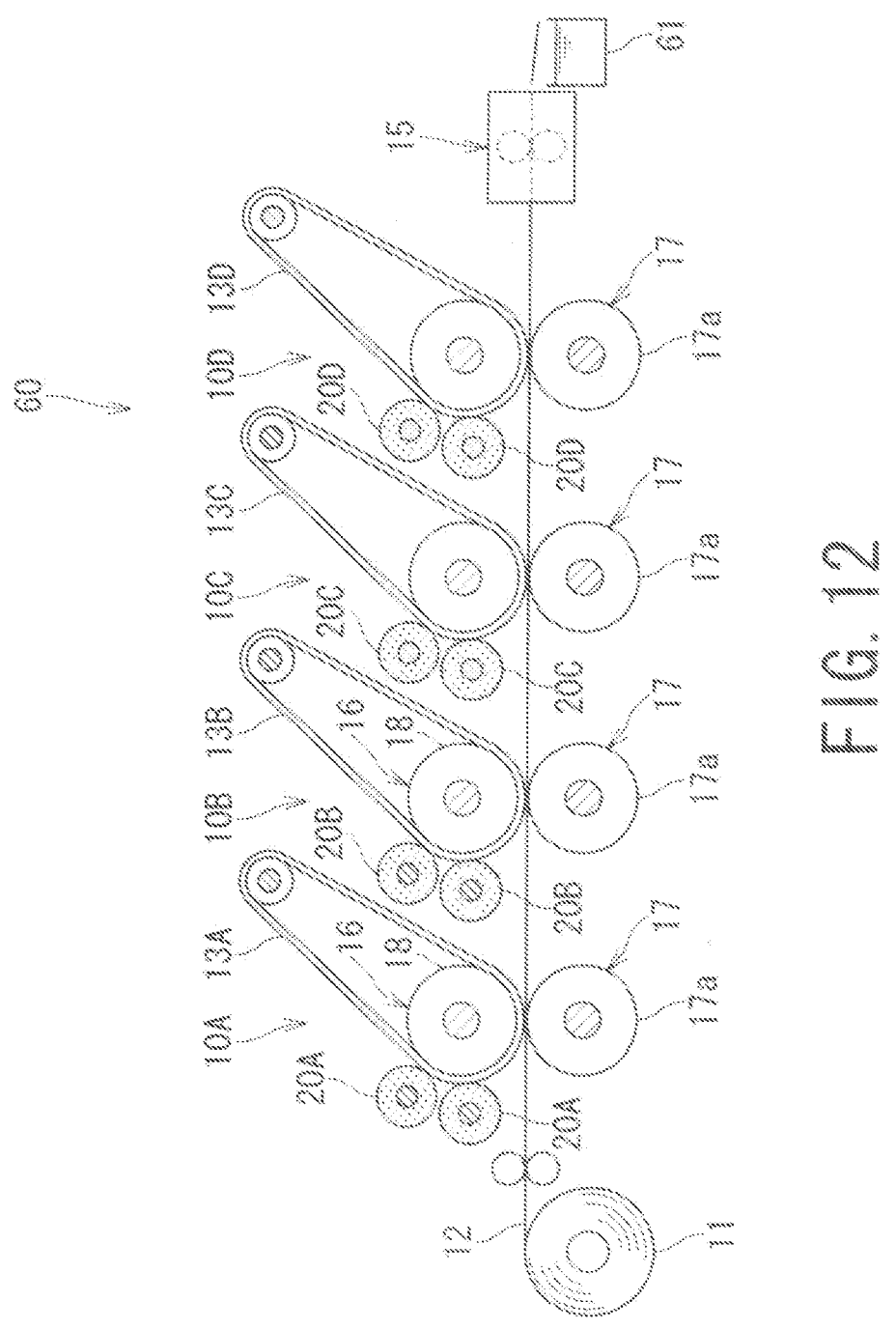

FIG. 12 is a configuration diagram showing a principle of a second embodiment of the printing apparatus.

A printing machine (printing apparatus) 60 of this embodiment is a rotary press type printing apparatus including four sets of printing apparatus 10A, 10B, 10C, and 10D disposed in series for effecting color printing or color photography printing onto a continuous form 12 which is fed out from a feed roll 11(E)ach of the 1st to 4th printing apparatus 10A, 10B, 10C, and 10D has structure and function identical to those of the printing apparatus 10 of the 1st embodiment, so that detailed explanation thereof are omitted by allotting identical numerals to similar members. The difference from the printing apparatus 10 of the 1st embodiment is that the respective printing apparatus 10A, 10B, 10C and 10D are equipped with ink rollers 20A, 20B, 20C and 20D, respectively, for supplying 4 color inks of yellow, red (magenta), blue (cyan) and black, respectively.

A rotary press type printing apparatus of the same type is used for each of the 4-color printing apparatus 10A, 10B, 10C and 10D, which include the flexible endless belt-shaped printing plates 13A, 13B, 13C and 13D, respectively, of the same length. The endless belt-shaped printing plates 13A, 13B, 13C and 13D are driven in synchronism with each other according to prescribed timings, so as to positionally align the image regions (motif parts) on the printed products.

The printed continuous form 12 is cut by a cutting device 15, for example, and the cut sheets are stored in a storage box 61.

The plate cylinder 18 (16) and the impression cylinder 17a(17) of each of the printing apparatus 10A, 10B, 10C and 10D are respectively composed of solid cylinders (steel cylinders) similarly as those in the printing apparatus 10 of the 1st embodiment. Each of the printing apparatus 10A-10D achieves the same function as in the 1st embodiment.

In the printing apparatus of the present invention, various endless belt-shaped printing plates can be interchangeably attached to a single plate cylinder 18 easily, and various longitudinal and transverse sizes of printing can be performed by simply exchanging the belt-shaped printing plates. This is different from the printing apparatus for offset printing, etc., which require different plate cylinders for different printing sizes.

Various sizes of solid cylinders may be used for the plate cylinder 18 and the impression cylinder 17a, for example, diameter sizes of 10 inches, 15 inches, 20 inches, 28 inches, and 30 inches.

In the above-mentioned second embodiment, a 4-color printing machine 60 was explained, but it is also possible to compose printing machines for other numbers of colors, e.g., those including 8-color printing apparatus or 5-color printing apparatus.

INDUSTRIAL APPLICABILITY

The present invention relates to a printing apparatus using an endless belt-shaped printing plate for printing on a continuous business form, a printing method using the apparatus, and a method of attaching the belt-shaped printing plate, and is directed to an application of relief printing technology.

The printing apparatus using an endless belt-shaped plate is used for a rotary press type printing machine, a flexographic printing machine, etc., for continuously printing on a continuous form wound in the form of a feed roll. The printed products are used, e.g., as payment paper for pension and insurance, or tax, calendar, contract, operation manual, specification, publication booklet, a seedling raising sheet.

It is also widely used for printing for producing sheet articles requiring high quality and high security, such as service tickets, travel tickets, gift certificates, vouchers, shopping tickets, money coupons, stock certificates, and debenture, from a continuous form provided in the form of a feed roll, In the printing apparatus, an elongated endless belt-shaped printing plate of several meters to several tens of meters formed from a lightweight resinous relief printing plates of 2 mm or less in thickness is wound about a plate cylinder and a guide cylinder. The plate cylinder and impression cylinder of the printing apparatus are formed as solid cylinders, and the movement of the endless belt-shaped printing plate wound about the plate cylinder and the guide roller is guided without causing slide or displacement.

Even when an endless belt-like resinous relief printing plate is used, the printing apparatus allows printing of microcharacters down to 0.3 point and dot printing or photographic printing of up to 300 screen lines. Further, by producing background design (or patter) or hidden characters (characters which cannot be read with naked eyes), it becomes possible to provide print products with enhanced security.

Further, according to the method of attaching a belt-shaped printing plate of the present invention, after an elongated resinous relief printing plate is wound about the plate cylinder and the guide roller, and the front end of the resinous relief printing plate is abutted to and engaged (combined) with the rear end thereof, an endless belt-shaped printing plate can be formed only by applying an adhesive tape from the printing surface side. The endless belt-shaped printing plate is formed in a state free from adverse effects due to an adhesive thickness affecting the printing, so that it is possible to provide a printing technology allowing beautiful and exact printing without printing unevenness, more specifically it becomes possible to even realize relief printing technology capable of printing of fine microscopic characters and halftone dot or photographic printing of up to 300 lines.

REFERENCE NUMERALS 10, 10A, 10B, 10C, and 10D: Printing apparatus
11: Feed roll
12: Continuous business form
13, 13A, 13B, 13C, and 13D: Endless belt-shaped printing plate
14: Winding roll
16: Plate cylinder
17: Impression cylinder
17a: Impression cylinder
18: Plate cylinder
18A: Cylinder plate surface
19: Guide roller
20, 20A, 20B, 20C, and 20D: Ink roller
21, 21A: Plate material for a resinous relief printing plate
22: Base film
23: Adhesive layer
24: Photosensitive resin layer
26: Film base
27, 27A: Resinous relief printing plate
30: Exposure device
32: Relief image
33: Back deposition layer
34: Marginal zone
37: Pin feed hole
39: Concavo-convex joint (Joint)
40: (One-side) Adhesive tape
41: Relief printing surface
43: Feed pin
45: Pin hole
46: Radial guide groove
47: Pin (body)
48: Pinhead
49: Cam slot
52: Cam ring
60: Printing machine
61: Storage box

The invention claimed is:

1. A printing apparatus using an endless belt-shaped printing plate, comprising:
   a plate cylinder, a guide roller and the endless belt-shaped printing plate wound about the plate cylinder and the guide roller for printing on a continuous form supplied between the plate cylinder and an impression cylinder, wherein
   said plate cylinder and impression cylinder are each composed as a solid cylinder formed by filing or sawing,
   said plate cylinder is provided with feed pins which are disposed in rows at an even pitch along an outer periphery of the plate cylinder at both ends in the axial direction of the plate cylinder so as to project and retract freely and guided by a fixed cam ring and so as to project out of the plate cylinder surface in a region forming a central angle of at least 150 degrees of the plate cylinder opposite to the guide roller of the plate cylinder,
   said endless belt-shaped printing plate is provided with pin feed holes at marginal zones at both sides in a width direction of the endless belt-shaped printing plate so that the pin feed holes are disposed in rows along the longitudinal direction of the endless belt-shaped printing plate at an even pitch which is identical to the pitch of said feed pins,
   said endless belt-shaped printing plate is formed as an elongated resinous relief printing plate having a thickness less than 1 mm and a length of 6 m to 9 m and including abutting or joined ends, each end having an unevenness pattern wherein the unevenness patterns of both ends are engaged with each other and mutually bonded with one side adhesive tape applied from the printing surface side, and
   said pin feed holes formed at the marginal zones of the endless belt-shaped printing plate are engaged with said feed pins of the plate cylinder, thereby guiding the movement of the endless belt-shaped printing plate,
   the printing apparatus provides resinous relief printing at a high-resolution of micro-characters at a size of 0.5 to 0.3 point and/or photograph printing at 175-300 lines on the continuous form.

2. The printing apparatus according to claim 1, wherein said elongated resinous relief printing plate is provided as a laminate structure having a total thickness of less than 1 mm and a relief image layer forming a printing surface and a back deposit layer reinforcing the relief layer, which are both formed of a solidified photosensitive resin layer, and are integrally formed on and with a film base.

3. The printing apparatus according to claim 2, wherein said photosensitive resin relief printing plate has a total thickness of less than 1 mm and includes the relief image layer with a relief depth of 500 μm-130 μm, and the back deposit layer having a thickness of 230 μm-600 μm to provide a total base thickness of 460 μm-820 μm together with the film base having a prescribed thickness.

4. The printing apparatus according to claim 2, wherein the relief image of the photosensitive resin layer is solidified in a taper shape enlarging toward the film base.

5. The printing apparatus according to claim 1, wherein the endless belt-shaped printing plate is formed of a plurality of elongated resinous relief printing plates connected longitudinally in series to form a belt and made endless by connecting both ends of the belt-shaped connected resinous relief printing plates, and each connection of both ends of an adjacent pair of resinous relief printing plates is formed by abutting and mutually engaging adjacent longitudinal ends each formed with a concavo-convex unevenness or zigzag shape of an adjacent pair of the elongated resinous relief printing plates, and is covered with an adhesive tape applied over the connection from the printing surface side.

6. The printing apparatus according to claim 1, wherein said plate cylinder is provided with a tubular flange integrally formed therewith at both axial ends thereof, and also pin holes formed at an even pitch in a circumference of the tubular flange, and said feed pins are radially disposed in respective pin holes so as to freely project and retract and are guided by the fixed cam ring so as to move relative to the plate cylinder and protrude out of the cylinder surface at least in a rotation region opposite to the guide roller of the plate cylinder.

7. The printing apparatus according to claim 6, wherein each feed pin comprises a pinhead engageable with one of the pin feed holes formed in the marginal zones of the endless belt-shaped printing plate, and a cam slot engageable with the fixed cam ring, and said fixed cam ring has a diameter smaller than that of the plate cylinder and a center which is shifted to a side opposite to the guide roller from the axial center of the plate cylinder.

8. The printing apparatus according to claim 7, wherein the plate cylinder sequentially forms a surface region where the pinheads retract from the surface, a surface region where the pinheads are gradually projecting toward the surface, a surface region where the pinheads project out of the surface, and a surface region where the pinheads are gradually retracting form the surface, in a rotation cycle of the plate cylinder, and the surface region where the pinheads project out of the surface is formed in a rotational surface region of the plate cylinder opposite to the guide roller.

9. The printing apparatus according to claim 8, wherein the surface region where the pinheads project out of the surface of the plate cylinder is provided with a central angle of about 150 degrees or more in a region opposite to the guide roller of the plate cylinder, and along with the movement of the endless belt-shaped printing plate wound about the plate cylinder and the guide roller, the pin feed holes thereof are engaged with the headpins of the feed pins of the plate cylinder while passing thorough the surface region where the pinheads are gradually projecting toward the surface, and are released from engagement with the headpins of the feed pins of the plate cylinder while passing through the surface region where the pinheads are gradually retracting from the surface of the plate cylinder.

10. The printing apparatus according to claim 1 further including an ink roller for applying an ink onto a plate surface of the endless belt-shaped printing plate, the endless belt-shaped printing plate transferring the ink onto a continuous form to be printed between the plate cylinder and the impression cylinder.

11. A printing apparatus comprising:
a solid plate cylinder;
a guide roller;
an endless belt-shaped printing plate wound about the plate cylinder and the guide roller; and
a solid impression cylinder cooperating with the endless belt-shaped printing plate at a position where the endless belt-shaped printing plate is wound about the plate cylinder to form a nip through which a continuous form can pass to print on the continuous form by resinous relief printing at a high-resolution of micro-characters at a size of 0.5 to 0.3 point and/or photograph printing at 175-300 lines on the continuous form.

\* \* \* \* \*